US006947349B1

(12) United States Patent
Abdollahi-Alibeik et al.

(10) Patent No.: US 6,947,349 B1
(45) Date of Patent: Sep. 20, 2005

(54) APPARATUS AND METHOD FOR PRODUCING AN OUTPUT CLOCK PULSE AND OUTPUT CLOCK GENERATOR USING SAME

(75) Inventors: Shahram Abdollahi-Alibeik, Menlo Park, CA (US); Chaofeng Huang, San Jose, CA (US)

(73) Assignee: T-RAM, Inc., San Jose, CA (US)

( * ) Notice: Subject to any disclaimer, the term of this patent is extended or adjusted under 35 U.S.C. 154(b) by 110 days.

(21) Appl. No.: 10/654,258

(22) Filed: Sep. 3, 2003

(51) Int. Cl.$^7$ ............................................. G11C 8/00
(52) U.S. Cl. ........................................ 365/233; 365/194
(58) Field of Search ............................ 365/233, 194, 365/189.05, 230.03

(56) References Cited

U.S. PATENT DOCUMENTS

| | | | |
|---|---|---|---|
| 5,298,866 A | 3/1994 | Kaplinsky | 327/261 |
| 5,424,980 A | 6/1995 | Vinal | 365/189.01 |
| 5,432,747 A | 7/1995 | Fuller et al. | 365/203 |
| 5,561,692 A | 10/1996 | Maitland et al. | 375/371 |
| 5,596,539 A | 1/1997 | Passow et al. | 365/210 |
| 5,703,815 A | 12/1997 | Kuhara et al. | 365/194 |
| 5,805,872 A | 9/1998 | Bannon | 713/500 |
| 5,831,924 A | 11/1998 | Nitta et al. | 365/230.03 |
| 5,963,502 A * | 10/1999 | Watanabe et al. | 365/233 |
| 5,999,482 A | 12/1999 | Kornachuk et al. | 365/233 |
| 6,081,462 A | 6/2000 | Lee | 365/194 |
| 6,084,805 A | 7/2000 | Pawlowski | 365/194 |
| 6,154,417 A | 11/2000 | Kim | 365/233 |
| 6,160,754 A | 12/2000 | Suh | 365/233 |
| 6,205,086 B1 | 3/2001 | Hanzawa et al. | 365/233 |
| 6,212,117 B1 | 4/2001 | Shin et al. | 365/205 |
| 6,229,161 B1 | 5/2001 | Nemati et al. | 257/133 |
| 6,278,637 B1 | 8/2001 | Kawaguchi | 365/189.05 |
| 6,318,707 B1 | 11/2001 | Hara et al. | 365/233 |
| 6,337,830 B1 | 1/2002 | Faue | 365/230.04 |
| 6,337,832 B1 | 1/2002 | Ooishi et al. | 365/233 |
| 6,392,957 B1 | 5/2002 | Shubat et al. | 365/233 |
| 6,430,075 B2 | 8/2002 | Morgan et al. | 365/51 |
| 6,446,180 B2 * | 9/2002 | Li et al. | 711/167 |
| 6,459,652 B1 | 10/2002 | Lee et al. | 365/233 |
| 6,462,359 B1 | 10/2002 | Nemati et al. | 257/107 |
| 6,490,206 B2 | 12/2002 | Kwon et al. | 365/189.05 |
| 6,650,575 B1 * | 11/2003 | Khanna | 365/194 |
| 6,707,759 B2 * | 3/2004 | Song | 365/233 |
| 6,741,507 B2 * | 5/2004 | Iwamoto | 365/194 |
| 2001/0043482 A1 | 11/2001 | Takeyama et al. | |
| 2002/0190265 A1 | 12/2002 | Hsu et al. | |
| 2003/0002355 A1 | 1/2003 | Janzen et al. | |

FOREIGN PATENT DOCUMENTS

| | | |
|---|---|---|
| WO | WO 02/082453 | 10/2002 |
| WO | WO 02/082504 | 10/2002 |

OTHER PUBLICATIONS

Nemati, Farid et al., "A Novel High Density, Low Voltage SRAM Cell with a Vertical NDR Device," T-Ram White Paper, VLSI (1998) 2 pages, http://www.t-ram.com/technology/about/vlsi98.pdf.

Nemati, Farid et al., "A Novel Thyristor-Based SRAM Cell (T-RAM) for High-Speed, Low-Voltage, Giga-scale Memories," T-Ram White Paper, IEDM (1999), 4 pages http://www.t-ram.com/technology/about/iedm99.pdf.

* cited by examiner

*Primary Examiner*—Tan T. Nguyen
(74) *Attorney, Agent, or Firm*—Haynes Beffel & Wolfeld LLP

(57) ABSTRACT

A method and apparatus generates output clock pulses, having leading and trailing edges that are adjusted in a pulse forming processor, according to the relative phase of an output clock and output data. Dynamic adjustment of the leading and trailing edges of output clock pulses improves the performance of high-speed devices significantly.

20 Claims, 20 Drawing Sheets

| Lower Control Bits mux_s<4:0> mux_sp<4:0> | | | | | Higher Control Bits mux_sh<3:0> mux_shp<3:0> | | | | cqf, aqf apf |
|---|---|---|---|---|---|---|---|---|---|
| 4 | 3 | 2 | 1 | 0 | 3 | 2 | 1 | 0 | Clock phase |
| X | X | X | X | X | 0 | 0 | 0 | 0 | Z |
| 0 | 0 | 0 | 0 | 0 | X | X | X | X | Z |
| 0 | 0 | 0 | 0 | 1 | 0 | 0 | 0 | 1 | In0 |
| 0 | 0 | 0 | 1 | 0 | 0 | 0 | 0 | 1 | In1 |
| 0 | 0 | 1 | 0 | 0 | 0 | 0 | 0 | 1 | In2 |
| 0 | 1 | 0 | 0 | 0 | 0 | 0 | 0 | 1 | In3 |
| 1 | 0 | 0 | 0 | 0 | 0 | 0 | 0 | 1 | In4 |
| 0 | 0 | 0 | 0 | 1 | 0 | 0 | 1 | 0 | In5 |
| 0 | 0 | 0 | 1 | 0 | 0 | 0 | 1 | 0 | In6 |
| 0 | 0 | 1 | 0 | 0 | 0 | 0 | 1 | 0 | In7 |
| 0 | 1 | 0 | 0 | 0 | 0 | 0 | 1 | 0 | In8 |
| 1 | 0 | 0 | 0 | 0 | 0 | 0 | 1 | 0 | In9 |
| 0 | 0 | 0 | 0 | 1 | 0 | 1 | 0 | 0 | In10 |
| 0 | 0 | 0 | 1 | 0 | 0 | 1 | 0 | 0 | In11 |
| 0 | 0 | 1 | 0 | 0 | 0 | 1 | 0 | 0 | In12 |
| 0 | 1 | 0 | 0 | 0 | 0 | 1 | 0 | 0 | In13 |
| 1 | 0 | 0 | 0 | 0 | 0 | 1 | 0 | 0 | In14 |
| 0 | 0 | 0 | 0 | 1 | 1 | 0 | 0 | 0 | In15 |
| 0 | 0 | 0 | 1 | 0 | 1 | 0 | 0 | 0 | In16 |
| 0 | 0 | 1 | 0 | 0 | 1 | 0 | 0 | 0 | In17 |
| 0 | 1 | 0 | 0 | 0 | 1 | 0 | 0 | 0 | In18 |
| 1 | 0 | 0 | 0 | 0 | 1 | 0 | 0 | 0 | In19 |

*FIG. 23*

| Lower Control Bits mux_s<4:0> mux_sp<4:0> | | | | | Higher Control Bits mux_sh<3:0> mux_shp<3:0> | | | | cqf, aqf apf |
|---|---|---|---|---|---|---|---|---|---|
| 4 | 3 | 2 | 1 | 0 | 3 | 2 | 1 | 0 | Clock phase |
| X | X | X | X | X | 0 | 0 | 0 | 0 | Z |
| 0 | 0 | 0 | 0 | 0 | X | X | X | X | Z |
|   |   |   |   |   |   |   |   |   |   |
| 0 | 0 | 0 | 0 | 1 | 0 | 0 | 0 | 1 | In0 |
| 0 | 0 | 0 | 1 | 0 | 0 | 0 | 0 | 1 | In1 |
| 0 | 0 | 1 | 0 | 0 | 0 | 0 | 0 | 1 | In2 |
| 0 | 1 | 0 | 0 | 0 | 0 | 0 | 0 | 1 | In3 |
| 1 | 0 | 0 | 0 | 0 | 0 | 0 | 0 | 1 | In4 |
|   |   |   |   |   |   |   |   |   |   |
| 1 | 0 | 0 | 0 | 0 | 0 | 0 | 1 | 0 | In5 |
| 0 | 1 | 0 | 0 | 0 | 0 | 0 | 1 | 0 | In6 |
| 0 | 0 | 1 | 0 | 0 | 0 | 0 | 1 | 0 | In7 |
| 0 | 0 | 0 | 1 | 0 | 0 | 0 | 1 | 0 | In8 |
| 0 | 0 | 0 | 0 | 1 | 0 | 0 | 1 | 0 | In9 |
|   |   |   |   |   |   |   |   |   |   |
| 0 | 0 | 0 | 0 | 1 | 0 | 1 | 0 | 0 | In10 |
| 0 | 0 | 0 | 1 | 0 | 0 | 1 | 0 | 0 | In11 |
| 0 | 0 | 1 | 0 | 0 | 0 | 1 | 0 | 0 | In12 |
| 0 | 1 | 0 | 0 | 0 | 0 | 1 | 0 | 0 | In13 |
| 1 | 0 | 0 | 0 | 0 | 0 | 1 | 0 | 0 | In14 |
|   |   |   |   |   |   |   |   |   |   |
| 1 | 0 | 0 | 0 | 0 | 1 | 0 | 0 | 0 | In15 |
| 0 | 1 | 0 | 0 | 0 | 1 | 0 | 0 | 0 | In16 |
| 0 | 0 | 1 | 0 | 0 | 1 | 0 | 0 | 0 | In17 |
| 0 | 0 | 0 | 1 | 0 | 1 | 0 | 0 | 0 | In18 |
| 0 | 0 | 0 | 0 | 1 | 1 | 0 | 0 | 0 | In19 |

*FIG. 25*

APPARATUS AND METHOD FOR PRODUCING AN OUTPUT CLOCK PULSE AND OUTPUT CLOCK GENERATOR USING SAME

REFERENCE TO RELATED APPLICATIONS

The present application is related to our co-pending U.S. patent application Ser. No. 10/654,358; entitled ARCHITECTURE AND METHOD FOR OUTPUT CLOCK GENERATION ON A HIGH SPEED MEMORY DEVICE; invented by Shahram Abdollahi-Alibeik and Chaofeng Huang; and filed on the same day as the present application; and the related application is incorporated by reference as if fully set forth herein.

The present application is related to our co-pending U.S. patent application Ser. No. 10/654,322; entitled APPARATUS AND METHOD FOR PRODUCING DUMMY DATA AND OUTPUT CLOCK GENERATOR USING SAME; invented by Shahram Abdollahi-Alibeik and Chaofeng Huang; and filed on the same day as the present application; and the related application is incorporated by reference as if fully set forth herein.

The present application is related to our co-pending U.S. patent application Ser. No. 10/654,561; entitled DELAY LINE AND OUTPUT CLOCK GENERATOR USING SAME; invented by Shahram Abdollahi-Alibeik and Chaofeng Huang; and filed on the same day as the present application; and the related application is incorporated by reference as if fully set forth herein.

BACKGROUND OF THE INVENTION

1. Field of the Invention

The present invention relates to output clock generation in high speed memory devices, and particularly in such devices having read latency greater than one output clock cycle.

2. Description of Related Art

Integrated circuits including high speed memory are operating at higher and higher clock rates. For example, some integrated circuits operate at 500 MHz and higher. At 500 MHz, a clock cycle is 2 nanoseconds, which approaches the propagation delays for signals on transmission lines on integrated circuits. Thus, clock timing and clock signal distribution problems arise at these high speeds. For high speed memories, read latencies can be more than one clock cycle.

In order to maintain high throughput in memories with read latencies that are more than one clock cycle, wave pipelining techniques are used. The pipeline allows output data to be supplied in each clock cycle, and absorbs the read latencies. In wave pipelines, the data being propagated in the memory is not latched during each clock cycle. Thus, the data can be considered to move in a "wave" through the device, which is basically mesochronous with the read clock.

In the design of clock circuits for high speed memories which use wave pipeline techniques, it is necessary to provide an output clock which matches output data with a mesochronous read clock more than one clock cycle earlier. Because of the mesochronous nature of the wave pipeline, and uncertainties in the propagation delays that occur on integrated circuits, the chips may provide output data within a tolerance that, depending on frequency, may be more than half a cycle wide. In this case, there may be both an up and a down transition in the clock within the acceptable tolerance for read latency. Thus, it is difficult to match the output data with the input read cycle in these circumstances.

Accordingly, it is desirable to provide techniques and architectures useful for output clock generation in a high speed, high-density memory device, which is suitable for use in wave pipeline architectures where read latencies may be more than one clock cycle long.

SUMMARY OF THE INVENTION

The present invention provides a method and an architecture for generating an output clock for a memory device in which read latency is more than one clock cycle. The architecture includes a memory with a clock generator located preferably at a central location on the device. A clock channel couples the clock generator to output structures for the memory. There is also a timing path which emulates the address/data paths in the memory, and is responsive to an address emulation signal produced by the clock generator to provide dummy data near the output structures for the memory. In a representative system, the timing path is co-located with the address/data paths in the memory and includes structures emulating the read path through the memory. The clock generator provides an output clock signal with an adjustable phase and a dummy data reference clock signal on the input of the clock channel. The address emulation signal and the dummy data reference clock signal have substantially equal periods that are a multiple of the output clock cycle long, such as two clock cycles if the output is latched one cycle after the read command. This way, only one transition in the dummy data, which is also a multiple of the output clock, occurs during a tolerance interval for the read latency of the memory.

A phase detector near the output structures receives the dummy data and the output clock signal from the clock channel, and includes logic to determine whether the output clock is early, late or on time with respect to the dummy data. Logic signals are produced at the phase detector, and returned to the clock generator for adjusting a relative phase of the output clock signal.

Techniques according to the present invention are embodied by an apparatus and method for producing dummy data based on timing paths co-located with the address/data paths of the memory. The technique for producing dummy data is particularly important for memory systems in which the output of memory cells do not normally provide large voltage swings, making them less practical for self timing approaches to dummy data generation. Also, a technique according to the present invention is embodied by a method and apparatus for generating output clock pulses, having leading and trailing edges adjusted according to the relative phase of an output clock and output signals, where the output signals are represented by dummy data in some embodiments. Dynamic adjustment of the leading and trailing edges of output clock pulses improves the performance of high-speed devices significantly. Yet another technique according to the present invention includes a delay line based on two-stage multiplexing, in which for all pairs of adjacent taps, a change from a current tap to an adjacent tap in the pair is executed by switching only one of the first stage and second stage multiplexers. A delay line according to this technique of the present invention is suitable for generation of an output clock having an adjustable phase, allowing for smooth, glitch-free adjustment over a large range of phases.

Output clock being early means that the output clock rising edge appears before the data transition and therefore, it captures the wrong data. Output clock being late means that the output clock rising edge appears after the data transition. In this case, it captures the correct data, but it increases the read latency unnecessarily. Output clock being on time means that the clock phase chosen is just right so that the transition in the output clock is after, but close to, the edge of the data transition, for capturing the data. The clock phase before this ideal phase is an early clock; the clock phase after this ideal phase is a late clock. Early data means the same as late clock, and vice versa.

In one embodiment, the output clock phase detector comprises logic which senses the levels of the dummy data and the dummy data reference clock signal at transitions of the output clock signal to determine whether differences in phase between the output clock signal and the dummy data are due to a late output clock signal or an early output clock signal.

Also, in some embodiments the output clock generator produces an early reference clock, having a period substantially equal to the period of output clock signal, and having transitions earlier than transitions of the output clock signal. Logic signals are produced at the phase detector by sensing the levels of the dummy data and the dummy data reference clock signal at transitions of the early clock which indicate whether the differences in phase between output clock signal and the dummy data exceed a threshold when the output clock is late. These logic signals, produced in response to the early reference clock, are used for adjusting the phase of the output clock signal for a late output clock, and prevent dithering which might be caused by reliance on comparisons with the output clock signal directly for this purpose.

In the adjustment of the relative phase of the output clock signal, the logic controls the clock generator so that the relative phase is increased if the dummy data is arriving late—after an early output clock signal transition. Thus, the clock phase is moved from a minimum value to account for the read latency out to an actually measured value relatively quickly. However, the logic controls the clock generator so the relative phase of the output clock signal is decreased if the dummy data is arriving early (output clock late) in some instances. However, decreasing of the relative phase of the output clock signal should only occur for worst-case propagation delays on the memory. Thus, the relative phase is decreased only if the dummy data is early in a number of sequential read cycles.

In large memories, the propagation delays, and thereby the read latencies, may vary depending on the particular region in the memory being read. Thus, the dummy data generation process is adapted to take into account the varying read latencies. In some embodiments, the address emulation signal is applied to banks of memory cells according to a scan pattern so that a set of samples of the dummy data represents the read latency for all of the banks in the scan pattern over a scan cycle. In these embodiments, the relative phase of the output clock signal is decreased only if the dummy data is early (output clock late), in a number of sequential read cycles equal to the number of samples in the set, such as the number of banks in the scan cycle.

In yet other embodiments, an output clock pulse generator is included which is responsive to the output clock signal to produce output clock pulses. The output clock pulse generator controls the rising edge and the falling edge of each output clock pulse. For example, when the output clock signal is on time or late (the dummy data is on time or early), the rising edge of the output clock pulse is produced in response to the rising edge of the output clock signal. If the output clock signal is early (the dummy data is late), then the rising edge of the output clock pulse is produced in response to the rising edge of the dummy data signal. The falling edge of the output clock pulse is produced in response to the falling edge of the output clock signal if the output clock signal is on time or late (the dummy data is on time or early). The falling edge of the output clock pulse is produced in response to a delayed output clock signal if the output clock signal is early (the dummy data is late). In this way, the duty cycle of the output clock pulse is maintained within the acceptable ranges for output clock signals when the dummy data is late, on time or early.

The clock generator in embodiments of the invention includes a delay locked loop which produces sense enable signals, and the address emulation signal for supply to the memory and to the timing paths. The address emulation signal is produced based on the output of the delay locked loop by dividing the frequency of a sense enable signal by two, in a representative embodiment. Also, the clock generator includes an adjustable delay line having a plurality of taps that output respective clock signals having increasing relative phases, and a multiplexer for selecting one of the plurality of taps as the output clock signal. Also, for an early reference clock, one of the plurality of taps, having a lesser relative phase than the output clock signal is selected by the multiplexer. In a representative embodiment, the dummy data reference clock signal is produced based on the output of the multiplexer by delaying the output clock signal and dividing the frequency of the delayed output clock signal by two and then inverting it. In this embodiment, the phase detection circuitry is made such that the level, not the transition, of this dummy data reference clock signal is important. In another embodiment, the dummy data reference clock is produced by just dividing the frequency of the output of the multiplexer by two. In this case, the transition of the dummy data reference clock is important for phase detection. The benefit of the former embodiment is that the delay of the frequency halver is not in the latency path.

In one embodiment, the multiplexer coupled to the delay line is decoded according to a unique pattern to avoid glitches in the adjustment of the phase of the selected clock signals.

The present invention can be applied to a memory device that comprises one or more blocks of memory, where each block of memory comprises a plurality of memory banks having respective sense amplifiers responsive to a sense enable signal produced, for example in the clock generator, or produced using self timed circuits, and having a period substantially equal to the output clock period. The address/data path comprises address path spines which extend a first direction among the plurality of memory banks, address path ribs that extend orthogonally with respect to the address path spines and decoding circuitry for enabling portions of the address path spines and address path ribs for access to an addressed memory bank. Also, data path spines extend in the first direction adjacent to memory banks to output structures for data from the memory block. Data path ribs among the memory cell banks extend orthogonally with respect to the first direction from the sense amplifiers in the plurality of memory banks to the data path spines. The timing paths for the address emulation signal and the dummy data emulate the address path spines, address path ribs, data path ribs and data path spines. In some embodiments, the timing paths are co-located with the address/data path spines and ribs.

One preferred embodiment of the invention is based on memory banks that comprise static random access memory cells. For example, thyristor based memory cells that are used in high-speed, high-density memory devices having a wave pipeline architecture, with an output clock generation architecture according to the present invention. The architecture is suitable for other types of memory cells, and other memory architectures, as well.

In one advantageous embodiment, the memory device comprises an integrated circuit having four or more memory blocks, each block including a plurality of banks. The clock generator is located centrally on the integrated circuit. The clock channel extends from the centrally located clock generator to phase detectors located near output structures for the memory blocks. The outputs of the phase detectors for each of the memory blocks on the left side and the outputs of the phase detectors on the right side of the integrated circuit are combined, respectively, and transmitted to clock control logic near the clock generator on the integrated circuit.

Accordingly, a basic method of the present invention includes generating an address emulation signal, a dummy data reference clock signal and an output clock signal in a common location on an integrated circuit memory device. The address emulation signal is applied to timing paths co-located with address/data paths in the memory. Dummy data is produced in response to the address emulation signal coming from the timing paths and ending at a phase detector near the output of the memory. The address emulation signal and the dummy data reference clock signal have substantially equal periods that are a multiple of the output clock cycle so that only one transition in the dummy data occurs during a tolerance interval for the read latency of the device. The invention includes transmitting the output clock signal and the dummy data reference clock signal on a clock channel that is independent of the address/data paths from the common location to a phase detector near the output of the memory. Also, logic signals are supplied from the phase detector indicating whether the output clock signal is early, on time or late. The relative phase of the output clock signal is adjusted at the common location in response to the logic signals. Finally, an output clock pulse is shaped based on the timing of the dummy data and the output clock signal. The output clock pulse is used for latching output data in output structures for the device, and in some embodiments for supply as an echo clock to external devices.

Other aspects and advantages of the present invention can be seen on review of the drawings, the detailed description and the claims, which follow.

BRIEF DESCRIPTION OF THE DRAWINGS

FIG. 23 is a table illustrating prior art decoding techniques for delay lines.

FIG. 25 is a table illustrating decoding techniques for a delay line according to the present invention.

DETAILED DESCRIPTION

Figure 1:
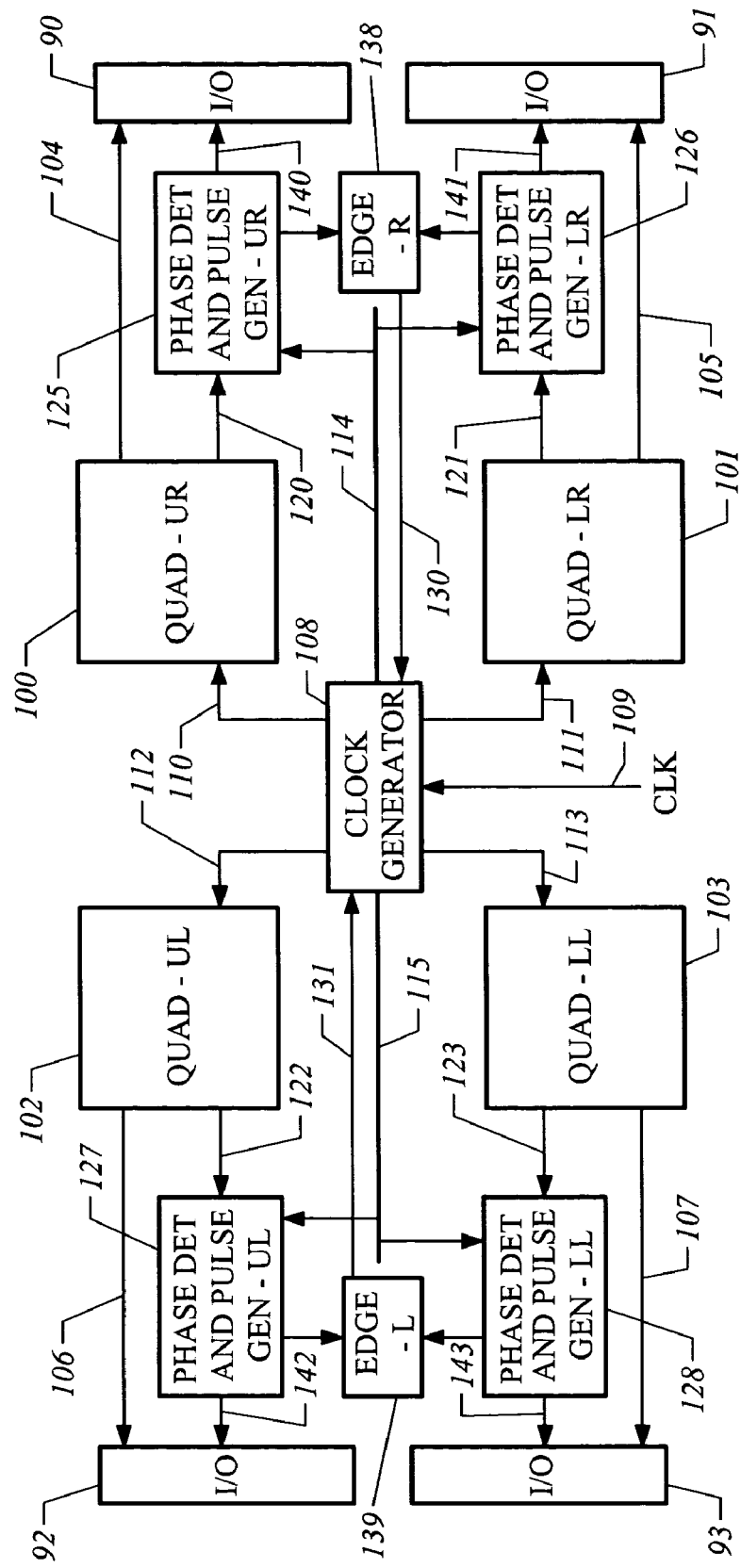
FIG. 1 is a simplified block diagram of an integrated circuit memory device having circuitry for generation of an output clock according to the present invention.

A detailed description of embodiments of the present invention is provided with reference to FIGS. 1–26. FIG. 1 is a block diagram of a high-speed, high-density SRAM including clock generation circuitry according to the present invention. In one preferred embodiment, the SRAM comprises a plurality of blocks of memory cells. In FIG. 1, there are four blocks of memory cells identified as the upper right quadrant 100, lower right quadrant 101, upper left quadrant 102, and lower left quadrant 103. In a preferred embodiment, the memory cells comprise thyristor-based SRAM cells, such as described in Nemati et al., "A Novel Thyristor-based SRAM Cell (T-RAM) for High-Speed, Low-Voltage, Giga-scale Memories," IEDM 1999. In other embodiments, other types of memory technologies are utilized, including standard six transistor SRAM technology, DRAM technology, and other types of volatile and non-volatile memory cell technologies. Thyristor-based SRAM cells are distinguished by relatively small voltage pulses generated on bit lines during a read cycle, as compared to the full voltage swing often generated using more typical SRAM technologies.

The memory blocks 100–103 include address and data paths, and operate in a read operation in response to addresses (not shown). They output data on lines 104 through 107 for supply to input/output structures 90–93, respectively, according to any of a variety of well-known memory array architectures. The memory blocks 100–103 also include timing paths, which, as input, receive address emulation signals along with other timing signals on lines 110–113, and supply dummy data as output on respective lines 120–123. The timing paths (including the dummy data path) are implemented such that they emulate the address/data paths through the memory. Embodiments of the invention include timing paths that are co-located with the address/data paths so that the propagation delays through the timing paths closely match those through the address/data paths with which they are co-located.

In the architecture shown in FIG. 1, the clock generator 108 is included on the integrated circuit. The clock generator is responsive to an input clock from line 109, and produces timing signals for supply on lines 110–113 to respective memory blocks 100–103. It also produces clock signals for supply on a clock channel 114 to the right side of the chip, and on a clock channel 115 to the left side of the chip. The clock channels 114 and 115 carry signals produced in the clock generator, which are used for controlling the relative phase of the output clock, and for the generation of output clock pulses. In one embodiment, the signals carried on the clock channels 114 and 115 include an output clock signal, an early reference clock signal, and a dummy data reference clock signal. The timing signals supplied to the respective memory blocks 100–103 include sense enable signals, and an address emulation signal. Other timing signals are supplied to the memory blocks as needed, according to the particular memory architecture utilized.

The dummy data on lines 120–123 carry information about the read latency caused by propagation delays through the respective memory blocks. The output clock signal and other signals at the far end of the clock channels 114, 115 (near the input/output structures 90–93) carry information about propagation delays along the clock channel.

In the embodiment shown, a phase detector and pulse generator circuit 125–128 is provided for each memory block 100–103, located near the input/output structures 90–93 for the respective blocks. The phase detector and pulse generator circuits 125–128 each include a phase detector which detects the relative phase of the dummy data to the output clock signal. The detected relative phase indicates whether the output clock signal is early, on time or late, relative to the dummy data, at the end of the clock channel 114, 115. The phase detector and pulse generator circuits 125–128, also each include an output clock pulse generator which produces the output clock on lines 140–143, used to latch data from lines 104–107 in the input/output structures 90–93, and optionally used for the generation of an echo clock output by the input/output structures 90–93.

The results of the phase detection in the phase detector and pulse generator circuits 125–128 are supplied to two edge logic units 138, 139 on the right and left sides of the chip, respectively. The edge logic units 138, 139 consolidate information from the phase detector and pulse generator circuits 125–128 on their respective sides of the chip, and return it to the clock control logic at the clock generator 108 on lines 130, 131, respectively.

Thus, the clock generation circuitry of the present invention generates output clock pulses for latching the output data on the memory chip. It also produces the echo clock on parts providing such output. The output clock pulses are placed in time, such that the latched data corresponds with a read command from a previous clock cycle. The clock architecture of the present invention supports systems in which data read latency is more than one clock cycle, such as one clock cycle plus a fraction of the cycle.

Furthermore, the clock architecture operates to place output clock pulses such that the rising edges of the clock occur in time with the output data from the memory blocks. By automatically placing the output clock pulses, there is no inherent maximum or minimum frequency of operation imposed by the clock architecture.

Figure 2:
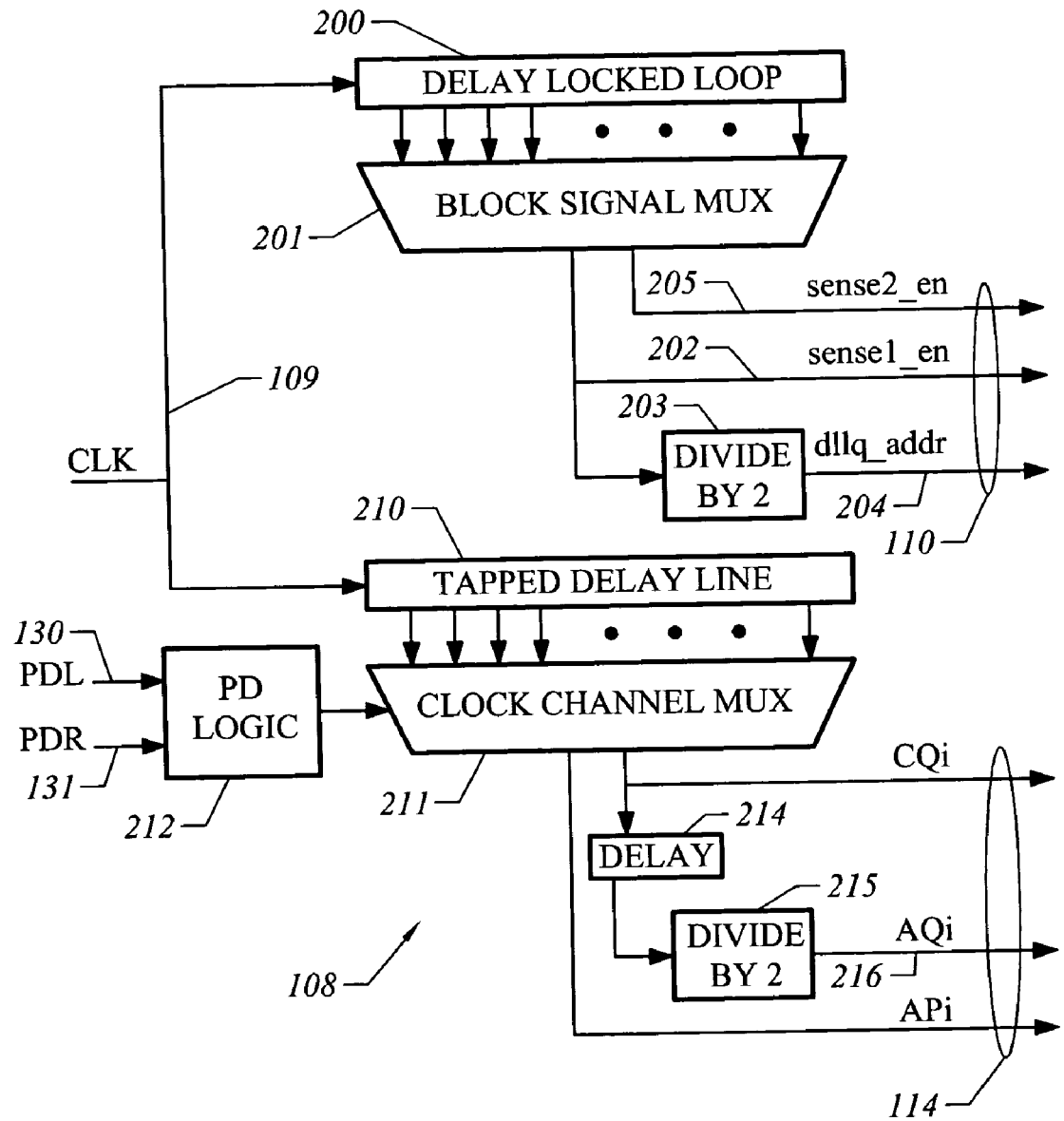
FIG. 2 is a simplified diagram of a clock generator for use in the system of FIG. 1.

FIG. 2 is a logic diagram for one embodiment for the clock generator 108 in the system shown in FIG. 1. The clock generator 108 includes a first delay locked loop 200 (see, FIG. 18) used for generating the timing signals that are applied to the memory blocks, such as the timing signals supplied on line 110 of FIG. 1. The outputs of the delay locked loop 200 are applied to a block signal multiplexer 201, used for selecting the relative phases of timing signals applied to the memory blocks.

The clock generator 108 also includes a tapped delay line 210 (see, FIGS. 19–25) used for generating the clock signals supplied to the clock channel, such as clock channel 114. The tapped delay line 210 includes a clock channel multiplexer 211 by which the relative phases of the clock signals are adjusted. The clock signal multiplexer 211 is controlled by clock control logic 212. Inputs to the clock control logic 212 include logic signals on lines 130, 131 from the right and left edge logic units 128, 129.

In the embodiment described, the timing signals applied on lines 110 to the memory blocks include sense1_en, sense2_en and dllq_addr on lines 202, 205 and 204, respectively. Sense1_en is a first level sense enable signal used for a first sensing stage in a memory architecture as described below. Sense2_en is a second level sense enable signal used for driving the output of the first level sensing on the data paths of the memory block. Dllq_addr is an address emulation signal. The address emulation signal is generated at the output of the divided by two logic 203 (which divides the frequency of its input by 2), which has as input the sense1_en signal from line 202. Thus, the address emulation signal is characterized by having a period which is a multiple of the period of the sense enable signals, and in particular, twice as long in this embodiment. Logically, the address emulation signal is equal to sense2_en divided by two in frequency. It is generated based upon sense1_en in this embodiment so that transitions in the address emulation signal do not line up precisely with transitions in the sense2_en signal.

Also in the embodiment described, the signals generated on the clock channel 114 include the output clock signal at the input of the clock channel CQi, a dummy data reference clock signal on the input of the clock channel AQi, and an early reference clock on the input of the clock channel APi. The output clock signal CQi has a relative phase to the CLK signal 109 determined by the clock channel multiplexer 211, which is set by the phase detector logic 212. The period of the output clock signal CQi is based on the input clock 109, and is substantially equal to the period of the sense enable signals. The early clock APi has a relative phase one or more taps earlier than the output clock signal. The dummy data reference clock signal is generated on line 216 by inverting the output of the divide by two logic block 215. The input of the divide by two logic block 215 is derived from the output of the delay unit 214, which outputs a delayed version of the output clock signal CQi to avoid simultaneous transitions of the signals. It can be seen that the dummy data reference clock signal AQi has a period substantially equal to the period of the address emulation signal dllq_addr.

Figure 3:
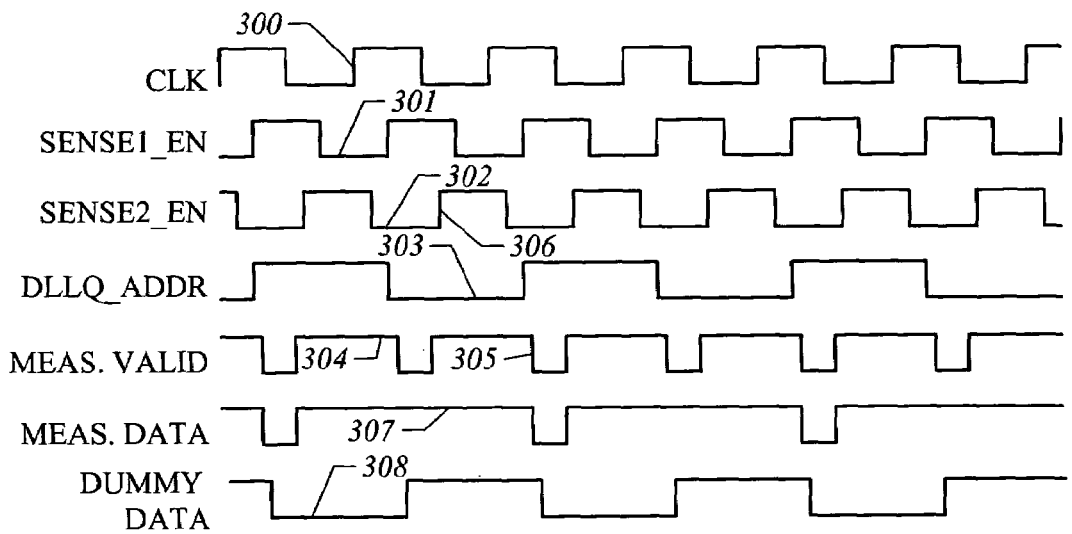
FIG. 3 is a timing diagram showing signals generated by the clock generator of FIG. 2.

FIG. 3 is a timing diagram which illustrates the timing signals applied to the memory blocks, and the generation of the dummy data in the timing pass through the memory blocks. The input clock signal from line 109 is illustrated on trace 300. Sense1_en on trace 301 is basically a phase of the input clock. Sense2_en on trace 302 is another phase, having a slightly greater relative phase than sense1_en. The phases of sense1_en and sense2_en are set according to the particular memory architecture being utilized. In the embodiment described below, sense1_en is used for a first level sensing, and the phase of sense2_en is set to allow results of first level sensing to settle prior to driving the results on the data paths of the memory block, in other words, prior to enabling the global sense amplifier. Dllq_addr on trace 303 has twice the period of the input clock, and is synchronized with sense1_en. FIG. 3 also illustrates a measure_valid signal, a measure_data signal and the dummy data signal which is generated on lines 120–123 of FIG. 1. The measure_valid signal near the output of a block is shown on trace 304. Measure_valid signal is normally high, and transitions low in response to the sense2_en signal, and appears after a propagation delay through the timing paths at a time such as shown in FIG. 3, tracking the delay of the global sense amplifiers, output buffers and output flight time across the data paths. Thus, transition 305 corresponds with the earlier rising edge 306 of sense2_en. Measure_data is shown on trace 307. The signal is shown at the output of the block after traversing the timing paths in the memory, similar to measure_valid signal. Measure_data transitions low in response to sense2_en at the bank, when the address emulation signal, dllq_addr, is high. Thus, measure_data transitions low every other cycle of measure_valid. The dummy data signal at the output of the block is shown on trace 308. Dummy data is generated by latching the measure_data signal in response to the measure_valid signal. Thus, dummy data transitions only once per period of the sense2_en signal. The relationship between measure_valid and measure_data is similar to the relationship between corresponding read data signals, such as a read_valid signal and actual data read from a bank of memory within the block. Therefore, it mimics the delay of the bank read path.

The output clock generation scheme of the present invention may be applied using other methods for generating dummy data from the memory block. For thyristor-based cells, the method for generating dummy data described above is efficient and effective.

Figure 4:
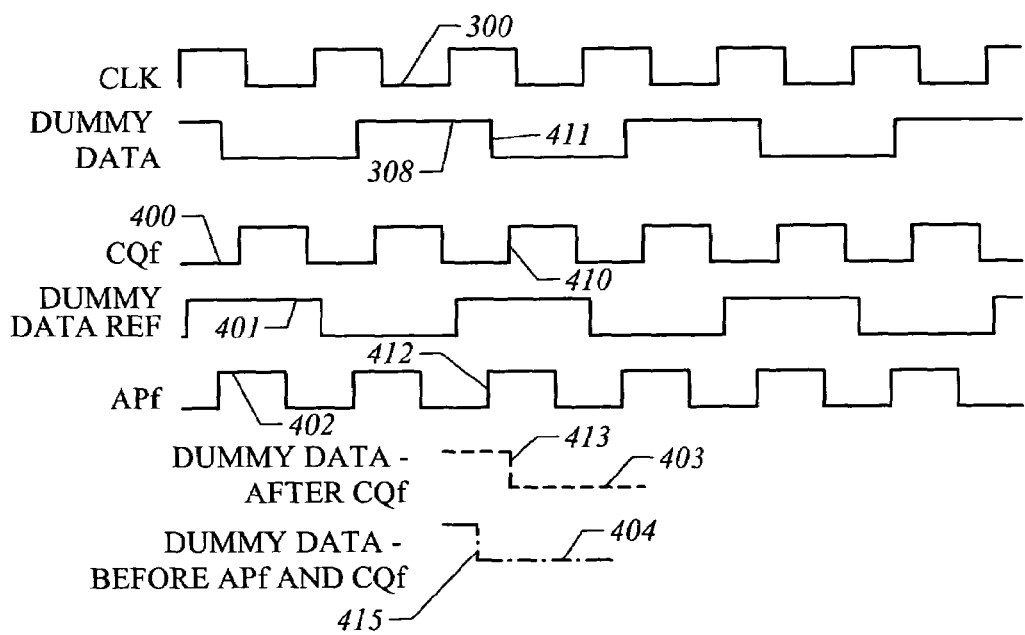
FIG. 4 is a timing diagram illustrating the relative phase of the output clock and the dummy data and other signals according to the present invention.

FIG. 4 is a timing diagram illustrating the signals applied on the clock channel 114 by the clock generator 108. The input clock from line 109 and dummy data (copy of trace 308) are included in FIG. 4 for reference. The output clock signal at the output of the clock channel CQf is shown on trace 400. CQf is simply CQi after propagation down the clock channel. The dummy data reference clock signal AQf is shown on trace 401. The dummy data reference clock signal AQf is the AQi signal 216 at the far end of the clock channel 114. AQi is set by the delay element 214 (FIG. 2) such that its level will match with dllq_addr at the rising edge of CQi. The early reference clock at the output of the clock channel 114 APf is shown on trace 402. The phase detection logic senses the relative phases of the dummy data and the output clock signal. When the output clock signal is on time, it transitions (e.g., transition 410) shortly after dummy data 308 transitions (e.g., transition 411) (the dummy data transition 411 is within a time interval between the Apf transition 412 and the CQf transition 410). When the output clock signal is early, as shown on trace 403, the dummy data transition 413 is after CQf transition 410. When the output clock signal is late, as shown on trace 404, the dummy data transition 415 is before.

Figure 5:
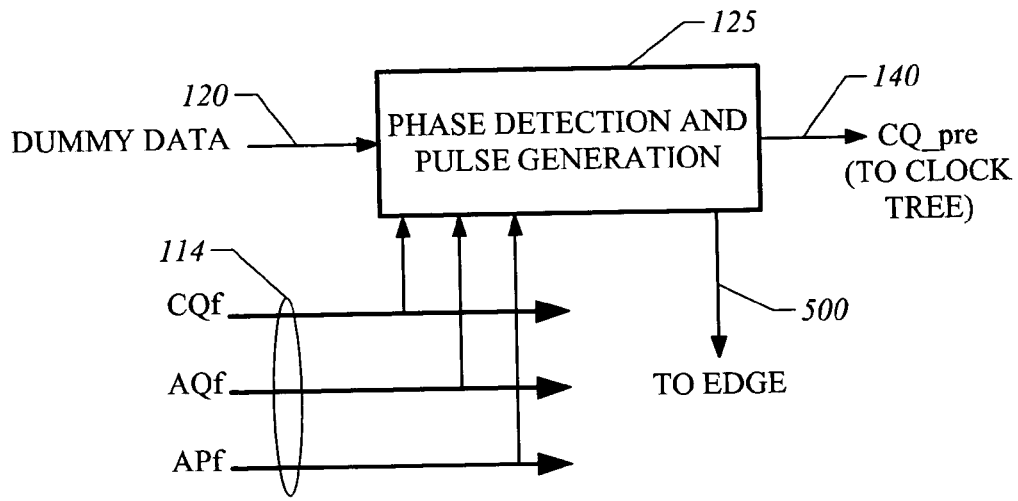
FIG. 5 is a simplified diagram showing signals related to the phase detection and pulse generator circuitry for the architecture of FIG. 1.

FIG. 5 illustrates input and output signals for one embodiment of the phase detector and pulse generation circuit 125 of FIG. 1. The inputs from the memory block include the dummy data on line 120. The inputs from the clock channel include the output clock signal CQf at the output of the clock channel 114, the dummy data reference clock signal AQf at the output of the clock channel 114, and the early reference clock APf at the output of the clock channel 114. The phase detector and pulse generation circuit 125 produces output clock pulses (CQ_pre) on line 140 for supply to the output structures for the device, and logic signals on line 500 for supply to the edge logic unit 128.

Figure 6:
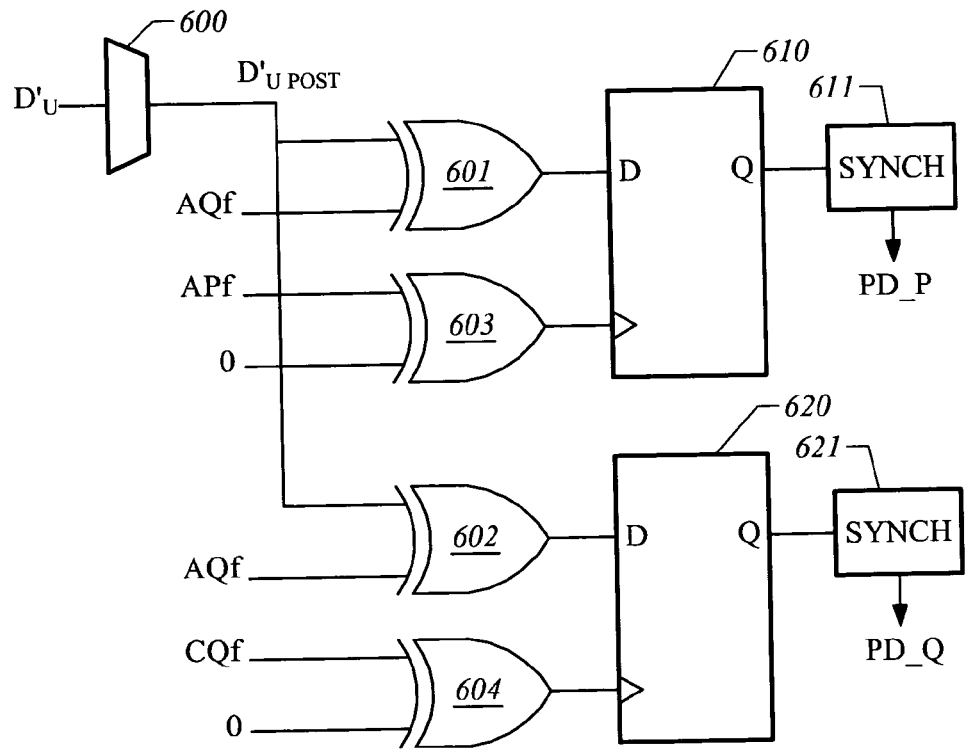
FIG. 6 is the logic diagram showing operation of the phase detection circuitry for the system of FIG. 5.

FIG. 6 is a logic diagram for phase detection logic in the block 125 of FIG. 5. The dummy data is applied via an element 600 that emulates a multiplexer in the data path for the memory block. The output of this element 600 is the input to the exclusive-OR gate 601, and the exclusive-OR gate 602. The other input to exclusive-OR gates 601 and 602 is the dummy data reference clock AQf.

The dummy data and the dummy data reference clock AQf both have the same clock source and their frequency halvers are synchronized. The dummy data represents the bank read delay, while the dummy data reference clock represents the clock coming from the center. As explained before, the read data should be available one cycle after the read command is issued. For this to hold for the dummy data, it should always have the opposite value of the dummy data reference clock at the time of detection. Therefore, the output of exclusive-OR gates 601 and 602 should be a logic one at the time of detection.

In FIG. 6, the early clock APf is applied as a first input to exclusive-OR gate 603. The second input to the exclusive-OR gate 603 is a logic zero. The output clock signal CQf is applied as input to exclusive-OR gate 604. The other input to exclusive-OR gate 604 is a logic zero. These gates are added to match the delays of gates 601 and 602.

The output of exclusive-OR gate 601 is applied to the D data input of a D-type flip-flop 610, which is clocked by the output of exclusive-OR gate 603. Thus, output Q of D-type flip-flop 610 is a logic one if the early clock APf can capture the correct data. The output of the D-type flip-flop 610 is synchronized with logic circuitry in synchronizer 611 and transmitted to the edge logic unit 128 as the signal PD_P.

The output of exclusive-OR gate 602 is applied to the D data input of the D-type flip-flop 620, which is clocked by the output of exclusive-OR gate 604. Thus, output Q of D-type flip-flop 620 is logic one if the output clock CQf can capture the correct data. The output of D-type flip-flop 620 is synchronized with logic circuitry in synchronizer 621 and transmitted to the edge logic unit 128 as the signal PD_Q.

Figures 7, 8:
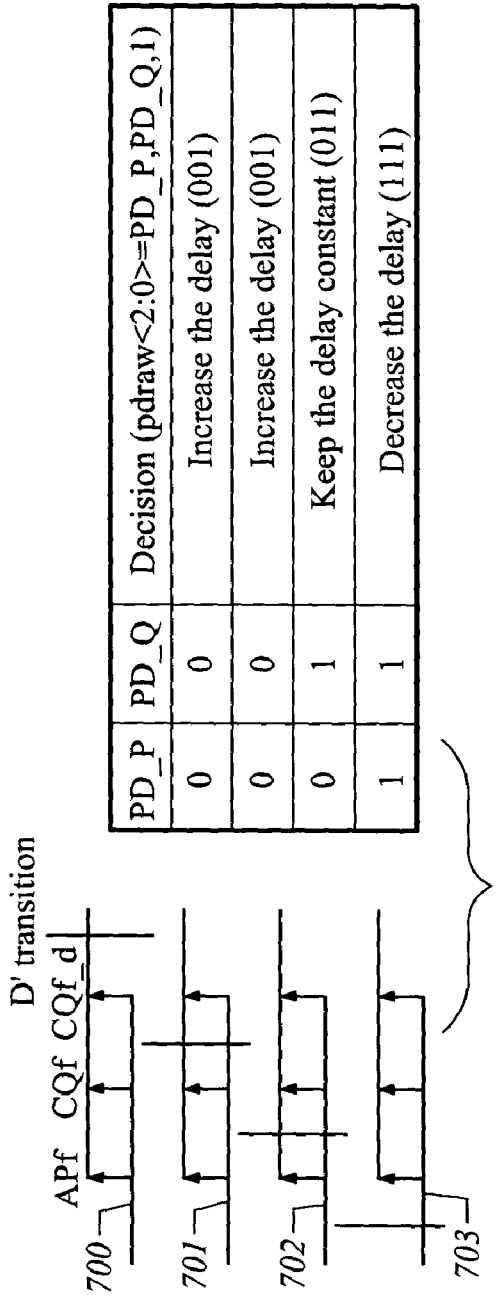
FIG. 7 is a table showing operation of the phase detection logic and the edge block for the system of FIG. 1.
FIG. 8 is a table showing operation of clock control logic for the clock generator in a system according to FIG. 1.

FIG. 7 illustrates the state of the control signals PD_P and PD_Q based upon the relative timing of the dummy data and the output clock signal and other timing signals in the phase detector circuits. In FIG. 7, trace 700 illustrates the early clock condition in which the dummy data transition occurs after the output clock signal CQf, and after a further delayed copy of the output clock signal CQf_d. In this situation, both PD_P and PD_Q are zero, and the phase detector circuit generates a decision logic signal (001), indicating that the relative phase of the output clock signal should be increased. Trace 701 illustrates the dummy data transition after the output clock signal CQf but before CQf_d. In this situation, both PD_P and PD_Q are zero, and the phase detector circuit also generates a decision logic signal (001).

Trace 702 shows, the on time clock condition in which the dummy data transition is before the output clock signal CQf, but after the early clock signal APf. In this situation, PD_P remains zero, but PD_Q is one. The phase detector circuit generates decision logic signal (011), indicating that no change in the relative phase of the output clock signal is necessary. In trace 703, the early clock condition is shown in which the dummy data transition is before both the output clock signal CQf and the early reference clock APf. In this situation, both PD_P and PD_Q are 1. The phase detector circuit generates the decision logic signal (111), indicating that the relative phase of the output clock signal could be decreased.

In the edge logic unit 128, the outputs of the phase detector circuits are consolidated to produce the left side PDL <1:0> and right side PDR <1:0> signals as shown in FIG. 8. Bit <0> of PDx (where x is either L or R), is equal to the NAND of bit <1> of the decision logic signal for the upper phase detector and bit <1> of the decision logic signal for the lower phase detector. Bit <1> of the PDx signal is equal to the AND of bit <2> of the decision logic signal for the upper phase detector and bit<2> of the decision logic signal for the lower phase detector. PDL and PDR are transmitted to the clock control logic in the clock generator 108 at the center of the chip which executes the logic illustrated in FIG. 8.

If either PDR or PDL is equal to (01), then the decision is to increase the delay, that is to increase the relative phase of the output clock signal at the input of the clock channel. If both PDR and PDL are equal to (10), then the phase will be decreased only if this logic status is repeated for a number n of sequential cycles, where in a preferred embodiment the number n is equal to an integer constant k times the number of banks scanned in a block of memory cells in a scan cycle. In one embodiment, k is equal to 1. In this manner, it is ensured that the output clock phase is not decreased except in response to the worst-case delay in memory blocks. In all other cases of PDL and PDR, the delay is kept constant.

In an ideal case, it should not be necessary to decrease the delay once the worst-case bank delay has been taken into account. However, there may be unknown glitches in chip operation which push the delay to an unreasonably high value. To prevent pushing the delay to an unreasonably high value, the delay reduction is included in preferred embodiments. However, the delay reduction is only done when there is sufficient evidence to do so. For example, the delay is not decreased when only one half of the chip requests it. If both halves are requesting reduction, the delay reduction decision is made only if those requests are arising from worst-case bank delays. Thus, the measure_valid signal is scanned through the banks according to a scan pattern. If the delay reduction request occurs sequentially through the scan pattern, then sufficient information has been gathered to decrease the delay.

The role of the early reference clock APf is to provide a measure for decreasing the delay. Without the early clock signal, the decision would necessarily be based on the output clock signal itself. However, this would result in output clock phase noise called dithering. The use of the early clock, with filtering done in the phase detection logic, greatly reduces dithering of the output clock signal phase.

Figure 9:
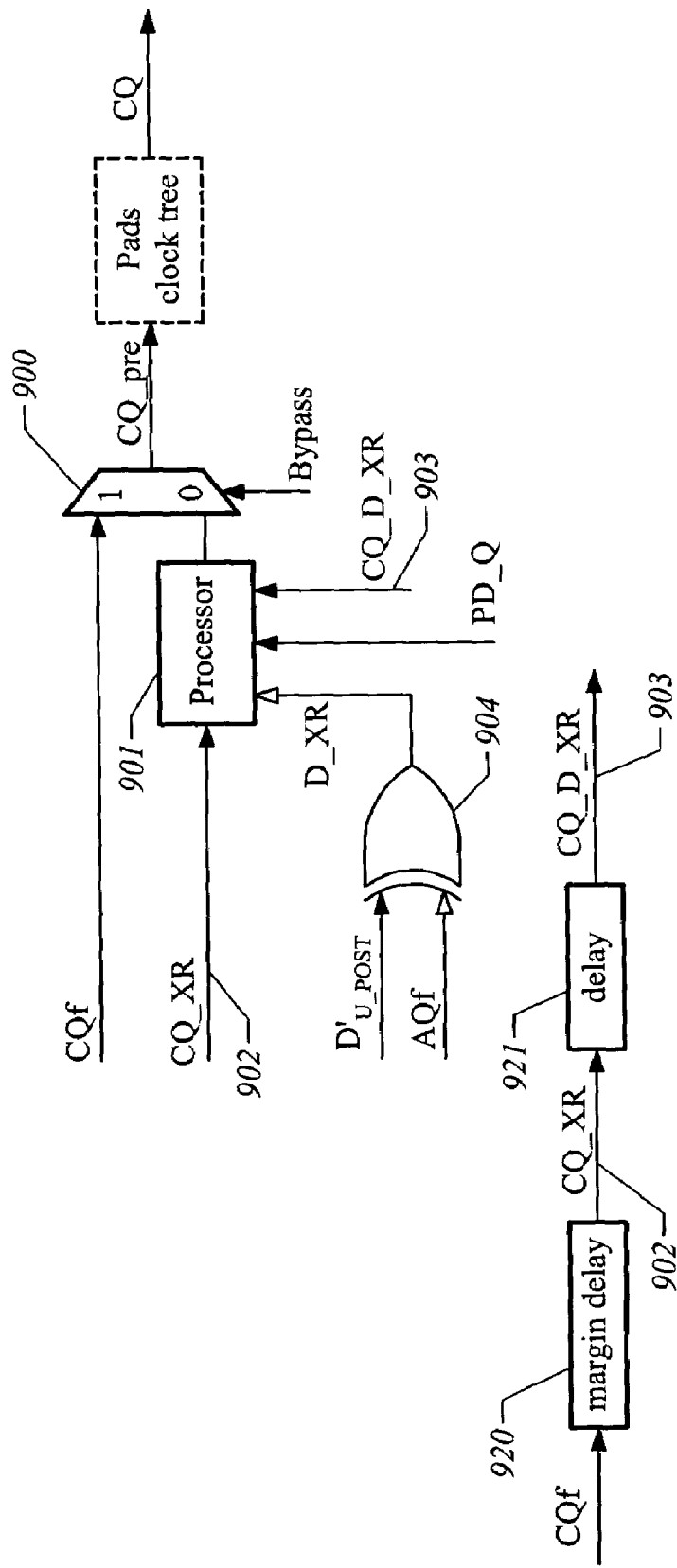
FIG. 9 is a simplified diagram of pulse generator logic for the system of FIG. 1.

FIG. 9 is a simplified diagram of the output clock pulse generator in the circuit blocks 125–128 of FIG. 1. In the diagram, multiplexer 900 is provided such that the output clock signal CQf from the output of the clock channel can be by passed directly to the clock tree for the input/output structures. This selection is provided for testing, and is not relevant to the present invention. The multiplexer 900 selects the output of processor 901 during normal operation of the product.

The inputs to the processor include versions of the output clock signal which are generated conceptually as shown in the diagram. The output clock signal CQf is applied to a margin delay 920, which includes the delay of the exclusive-OR gate 904. The result is the signal CQ_XR on line 902. The signal on line 902 is applied to the delay circuit 921, such as one or more buffers or inverters, which outputs a delayed output clock CQ_D_XR on line 903. The first input on line 902 is a first delayed clock signal CQ_XR and the input on line 903 is a second delayed clock signal CQ_D_XR. Other inputs to the processor 901 include the logic signal PD_Q indicating whether the dummy data transition occurs before or after the output clock signal transitions, and the output D_XR of the exclusive-OR gate 904. The inputs to the exclusive-OR gate 904 include dummy data (output of multiplexer 600 of FIG. 6) after the delay emulating output multiplexers, and the dummy data reference clock signal AQf, as discussed above. Thus, the signal D_XR is high when the dummy data and the dummy data reference clock mismatch.

Figure 10:
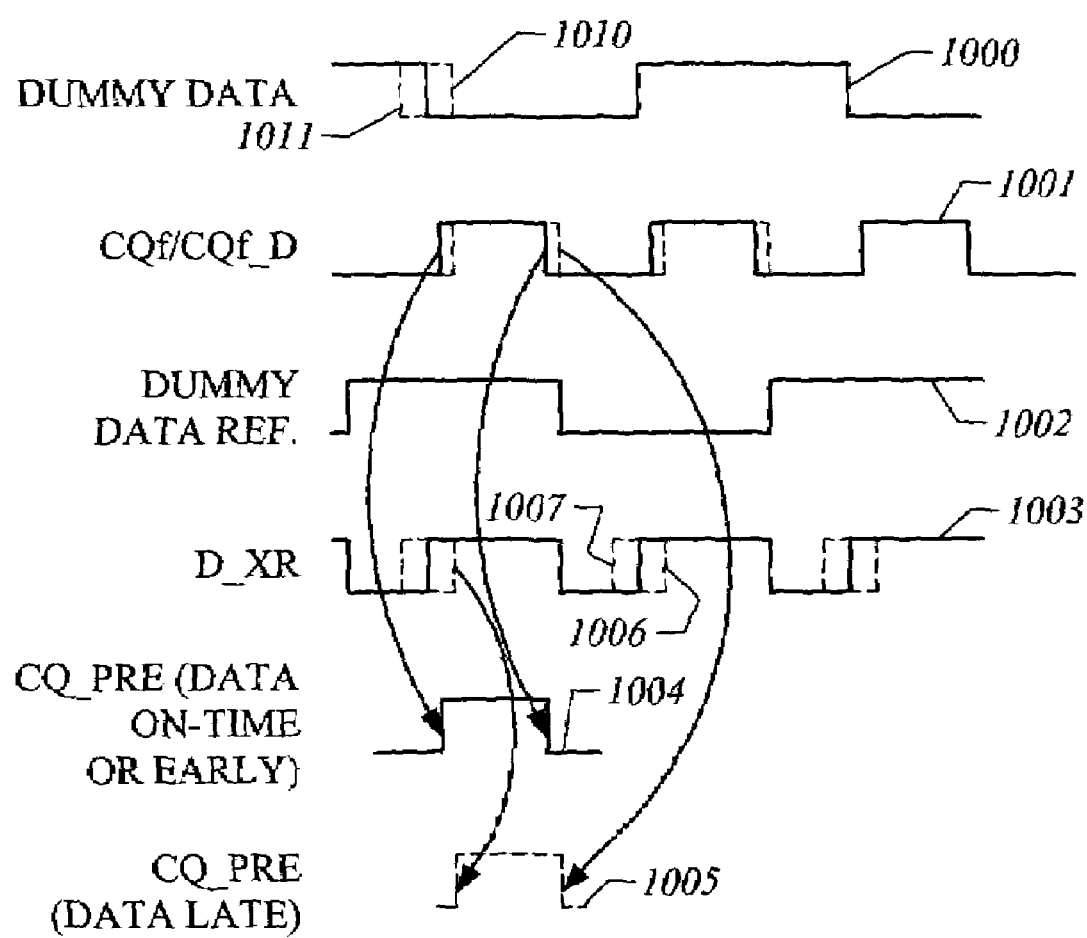
FIG. 10 is a timing diagram illustrating generation of output clock pulses for the system of FIG. 9.

FIG. 10 is a timing diagram illustrating operation of the processor 901. In FIG. 10, trace 1000 is the dummy data, with dashed line 1010 representing an early output clock condition (late dummy data), and trace 1011 representing the late output clock condition (early dummy data). Trace 1001 is the output clock signal version CQ_XR, with the dashed line representing the delayed output clock signal CQ_D_XR. Trace 1002 is the dummy data reference clock signal. Trace 1003 is the D_XR signal, with the trace 1006 representing the early output clock condition (late dummy data transition), and trace 1007 representing the late output clock condition (early dummy data transition). Thus, the processor of FIG. 9 provides an output clock pulse forming circuit, which produces output clock pulses having dynamically adjusted leading and trailing edges, for corresponding output clock cycles in response to the leading and following edges of the output clock cycles, and in response to a relative phase of transitions of the output signal, as represented in this embodiment by the dummy data, and the leading edges of the output clock cycles.

The clock pulse is shown in trace 1004 for the case when the output clock signal is on time or late (i.e., dummy data on time or early). In trace 1004, the output clock pulse has a rising edge generated in response to the output clock signal CQ_XR. The falling edge of the output clock pulse in trace 1004 matches the falling edge of the output clock signal CQ_XR, when the control signal D_XR is high. The clock pulse is shown in trace 1005 for the case when the output clock is early (i.e., dummy data is late). In this case, the output clock pulse does not transition high with the rising of the clock signal CQ_XR, but with the transition of the D_XR signal indicating that the dummy data is transitioning. The falling edge of the output clock pulse in trace 1005 transitions with the falling edge of the delayed output clock CQ_D_XR for the early output clock condition of trace 1005. In this manner, the output clock pulse has more high time. In memory parts with an echo clock, this output pulse generation technique is useful, as a memory controller communicating with the chip might use the falling edge of the echo clock to capture the data.

With a pulse generator for each half of the chip, an echo clock is provided for each half. If the data is late on one side, then the echo clock for that half will be late.

Figure 11:
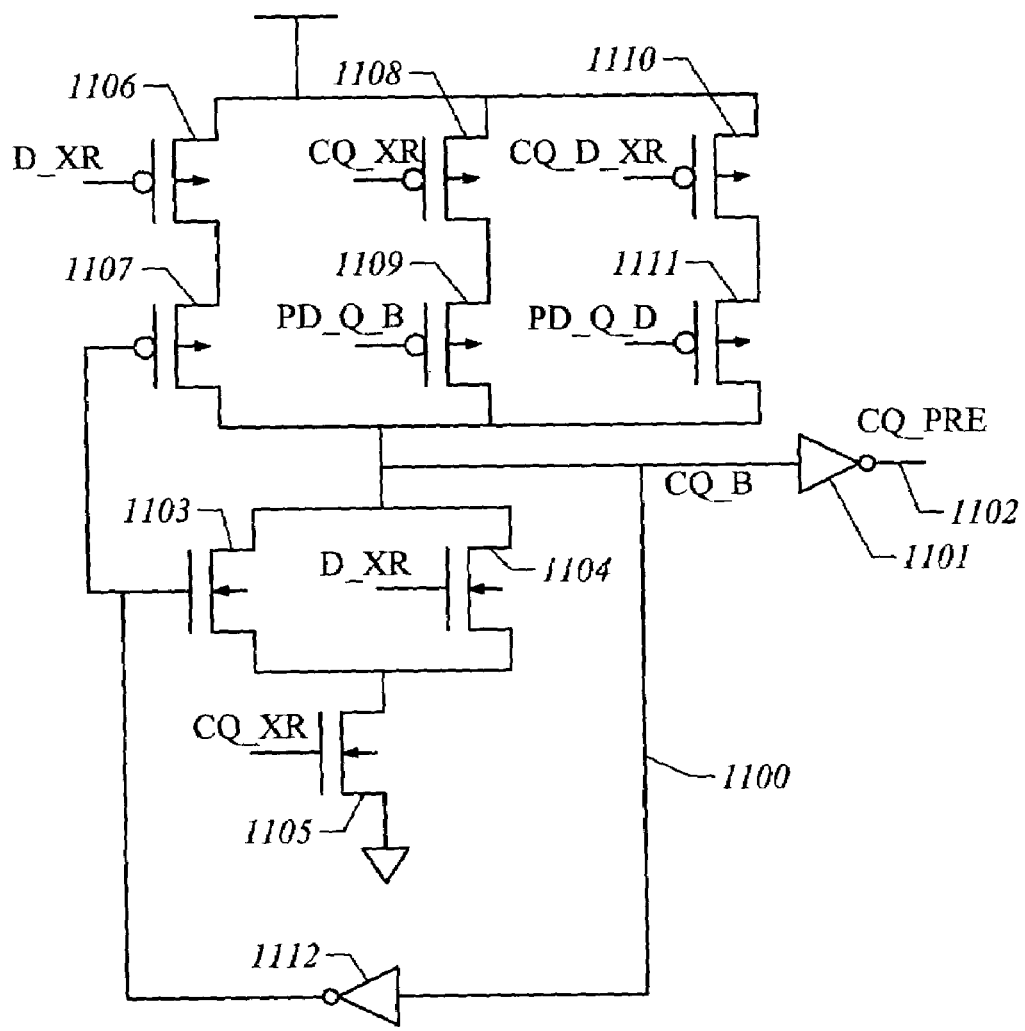
FIG. 11 is a more detailed circuit diagram of the pulse generator for the system of FIG. 9.

FIG. 11 illustrates a circuit implementation of the processor 901 in the pulse generator of FIG. 9. The circuit generates a clock signal CQ_B on line 1100 which is applied to inverter 1101 which outputs output clock pulses CQ_PRE on line 1102. N-type transistors 1103, 1104 and 1105 operate to pull down the clock signal CQ_B to define the rising edges of the output clock pulses. P-type transistors 1106, 1107, 1108, 1109, 1110, 1111 operate to pull up the clock signal CQ_B to define falling edges of the output clock pulses. Inverter 1112 feeds back an inverted version of CQ_B as inputs to the gates of transistors 1103 and 1107. The D_XR signal is applied to the gate of transistor 1106 and to the gate of transistor 1104. The output clock signal CQ_XR is applied to the gates of transistors 1105 and 1108. The delayed output clock signal CQ_D_XR is applied to the gate of transistor 1110. The logic signal PD_Q is processed as shown in FIG. 12 to produce the signals PD_Q_B and PD_Q_D, which are applied to the gates of transistors 1109 and 1111, respectively.

In operation, t6 produce a falling edge of CQ_B, the transistor 1103 will be initially off, and the later of the signals CQ_XR and DATA_XR to transition high will control the timing of the transition. In this way, the falling edge of CQ_B occurs on the rising edge of the output clock signal CQ_XR if the output clock signal is on time or late. Else, the falling edge of CQ_B occurs on the transition of D_XR. After CQ_B transitions low, the output of the inverter 1112 will become high, which will turn on transistor 1103 and turn off transistor 1107. This will keep CQ_B low, even when D_XR transitions low (FIG. 10, trace 1003).

To produce a rising edge of CQ_B, the transistor 1107 will be off due to the output of the inverter 1112. The timing of the rising edge is controlled by the output clock signal CQ_XR, if the signal PD_Q_B is low (the output clock was on time or late). The timing of the rising edge is controlled by the delayed output clock CQ_D_XR if the signal PD_Q_D is low (the output clock was early). This will stretch the pulse width slightly.

Figure 12:
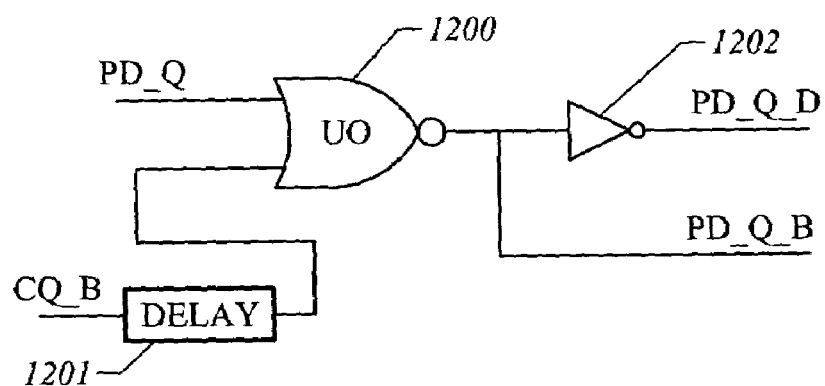
FIG. 12 illustrates logic for generating control signals used in the circuitry of FIG. 11.

The signal PD_Q_B is produced at the output of the NOR gate 1200 of FIG. 12. The inputs to the NOR gate 1200 in FIG. 12 include the PD_Q signal, which goes high when the dummy data arrives before the output clock signal CQf. The other input is the output of delay element 1201, which receives as its input the CQ_B signal. This scheme guarantees that PD_Q phase detection signal only controls the rising edge of CQ_B, i.e., PD_Q goes through the NOR gate only when CQ_B is low. When CQ_B is high, PD_Q_B is low and PD_Q_D is high, regardless of the value of PD_Q. This will mean that the falling edge is only controlled by CQ_XR and D_XR, as desired.

Figure 13:
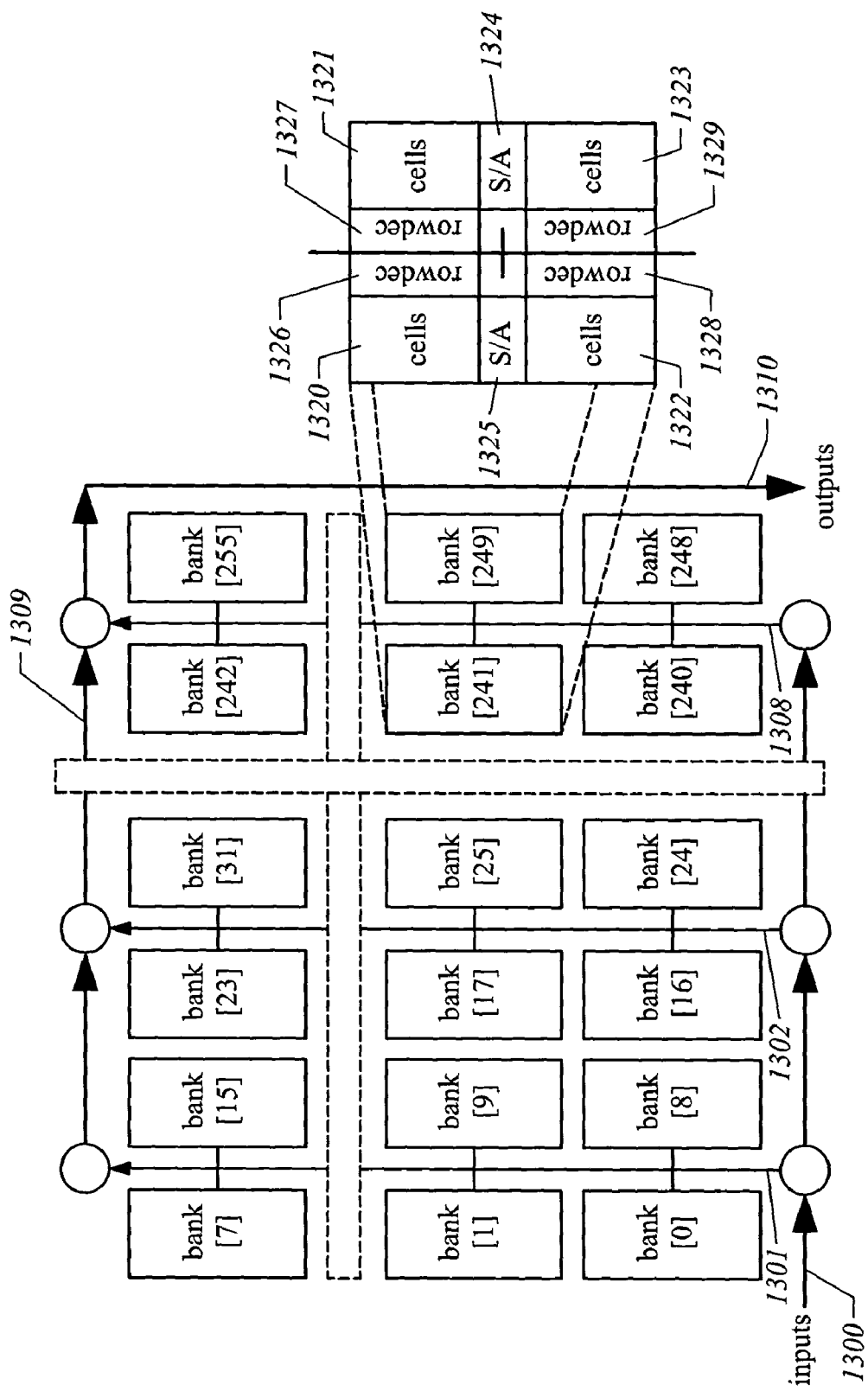
FIG. 13 illustrates a representative architecture for a memory block comprising a plurality of banks according to one embodiment of the present invention.

FIGS. 13–16 illustrate an implementation of the address/data paths of a memory block, with co-located timing paths according to an embodiment of the present invention in which the memory cells are implemented with thyristor-based SRAM cells. FIG. 13 illustrates the basic configuration of a memory block, including a plurality of banks of memory cells. In the example shown, 256 banks (bank (0)-bank (255)) are arranged in eight rows and 32 columns. Two columns share an address/data path rib, making an eight row by 16 rib array within a memory block. An address/data path spine 1300 is arranged horizontally along the bottom of the block. Address/data path ribs 1301, 1302, . . . 1308 are arranged orthogonally relative to the spine and extend vertically among the bank pairs. An output spine 1309 extends horizontally above the block towards an output bus 1310, which transmits the output data and timing signals to the output structures and to the phase detector and pulse generator block as described above.

In one embodiment, a bank pair is arranged as a unit including four sub-arrays 1320–1323 of thyristor-based memory cells. Local sense amplifiers 1324, 1325 with column decoding are arranged on the left and right sides of the rib, and shared between the top and bottom sub-arrays. Row decoders 1326–1329 for selecting rows within the banks, and read bank address and measure bank address decoders (not shown) for enabling the respective banks, are arranged for each of the four sub-arrays.

The inputs to the banks in the block are distributed in a two-step process. The input signals are first distributed globally along the input spine 1300, and then distributed locally up a rib. Similarly, the output signals first travel up a rib, and are combined globally along the output spine 1309. Signals are decoded along the address/data paths, and transmitted only on ribs that require the signal.

Figure 15:
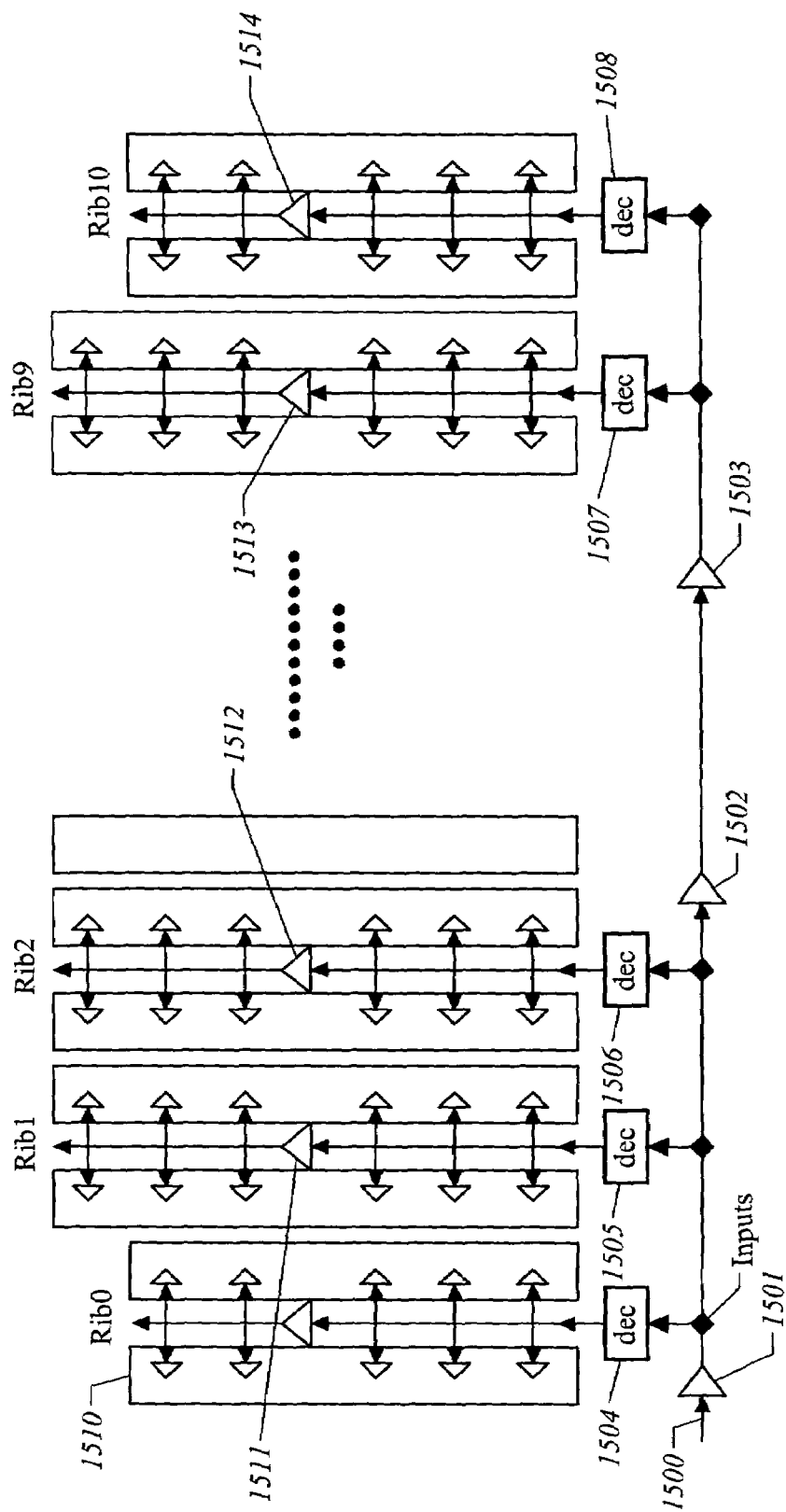
FIG. 15 illustrates logic for distributing address signals and timing signals to address path ribs according to an architecture like that shown in FIG. 13.

In the embodiment of FIG. 1, four identical blocks are arranged on the chip. In one preferred embodiment, the memory blocks include 128 banks arranged along 11 ribs (FIG. 15). Nine of the 11 ribs are connected to six rows of banks. Two ribs out of the 11 ribs are connected to five rows. A wide variety of other arrangements for the memory blocks could be implemented.

Figure 14:
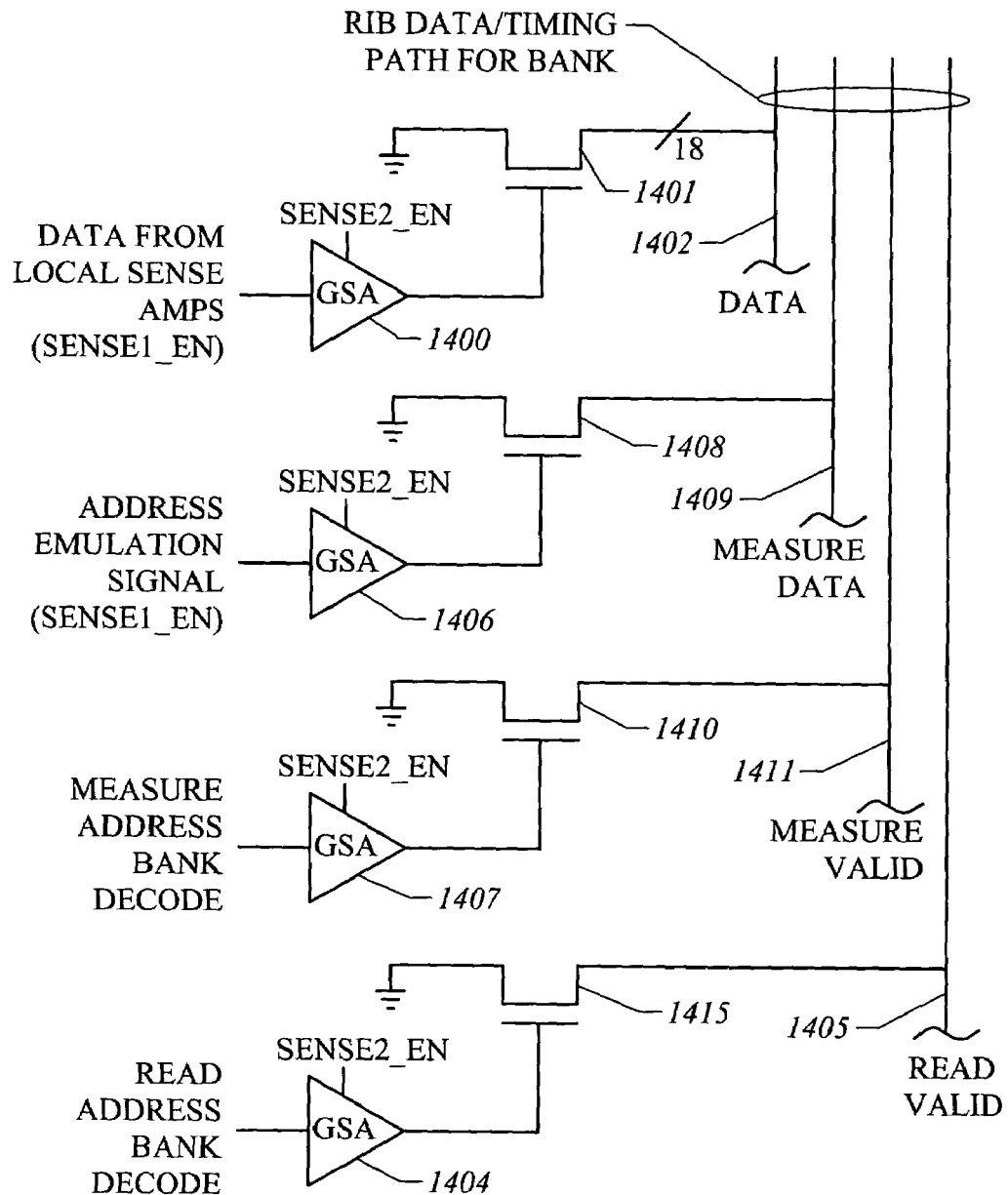
FIG. 14 illustrates circuitry for applying data and timing signals from a memory bank to data path ribs according to an architecture like that shown in FIG. 13.

FIG. 14 illustrates global sense amplifier operation, along with the techniques used for producing the measure_valid and measure_data signals discussed above, using timing paths that are co-located with the address/data paths. As shown in FIG. 14, data from the local sense amplifiers in the memory banks which operate in response to sense1_en, is applied to a global sense amplifier 1400, which operate in response to sense2_en. The global sense amplifier drives the gate of transistor 1401. Thus, when the output of the global sense amplifier 1400 is high, transistor 1401 pulls down the data line 1402 on the data path for the rib. In the embodiment illustrated, there are 18 data lines on the rib. A read valid signal is generated using a similar structure, in which the global sense amplifier 1404 receives the output of a read address bank decoder, identifying the corresponding bank, and drives the gate of pulldown transistor 1415. The read valid signal on line 1405 is a pulse produced by transistor 1415 and timed with sense2_en. Near the end of the data path, the pulse on the data line 1402 is latched by the read_valid signal on line 1405 to produce output data, which will be latched in response to the output clock pulses generated as described above. Likewise, near the end of the data path, the pulse on the measure data line 1409 is latched by the measure_valid signal on line 1411 to produce dummy data.

The timing signals are generated on timing paths co-located in the ribs with the data paths using global sense amplifier 1406 and global sense amplifier 1407. The address emulation signal dllq_addr synchronized with sense1_en, is transmitted by global sense amplifier 1406 to the gate of transistor 1408. The resulting pulse on line 1409 is the measure_data signal for the corresponding bank. Likewise, a measure address bank decode signal is applied as input to the global sense amplifier 1407. Global sense amplifier 1407 drives the gate of transistor 1410, generating a pulse on line 1411 as the measure_valid signal. Accordingly, the timing signals are generated using signal paths that emulate the address/data path used for reading data from the memory bank.

FIG. 15 illustrates implementation of an input spine and rib configuration according to an embodiment of the present invention. In the embodiment shown in FIG. 15, there are 11 ribs (rib0 through rib10). Inputs are applied on line 1500, which has buffers 1501, 1502, 1503 distributed along the line as appropriate. The spine is constructed so as to be as fast as possible by optimizing wire geometry and placement of the buffers. Between each paired column of banks, a rib pre-decoder 1504, 1505, 1506, . . . 1507, 1508 is tapped onto the input spine. The pre-decoders drive the respective ribs which are also periodically re-buffered by buffers 1510, 1511, 1512, . . . 1513, 1514. After pre-decoding, only one of 10 banks is selected on ribs rib0 and rib10, and only one of 12 banks is selected on the other ribs. Thus, a memory address is reduced to four bits along the rib. The memory address and address simulation signals are propagated up the rib with a measure address, as described below, and with other timing signals, including the sense enable signals.

Figure 16:
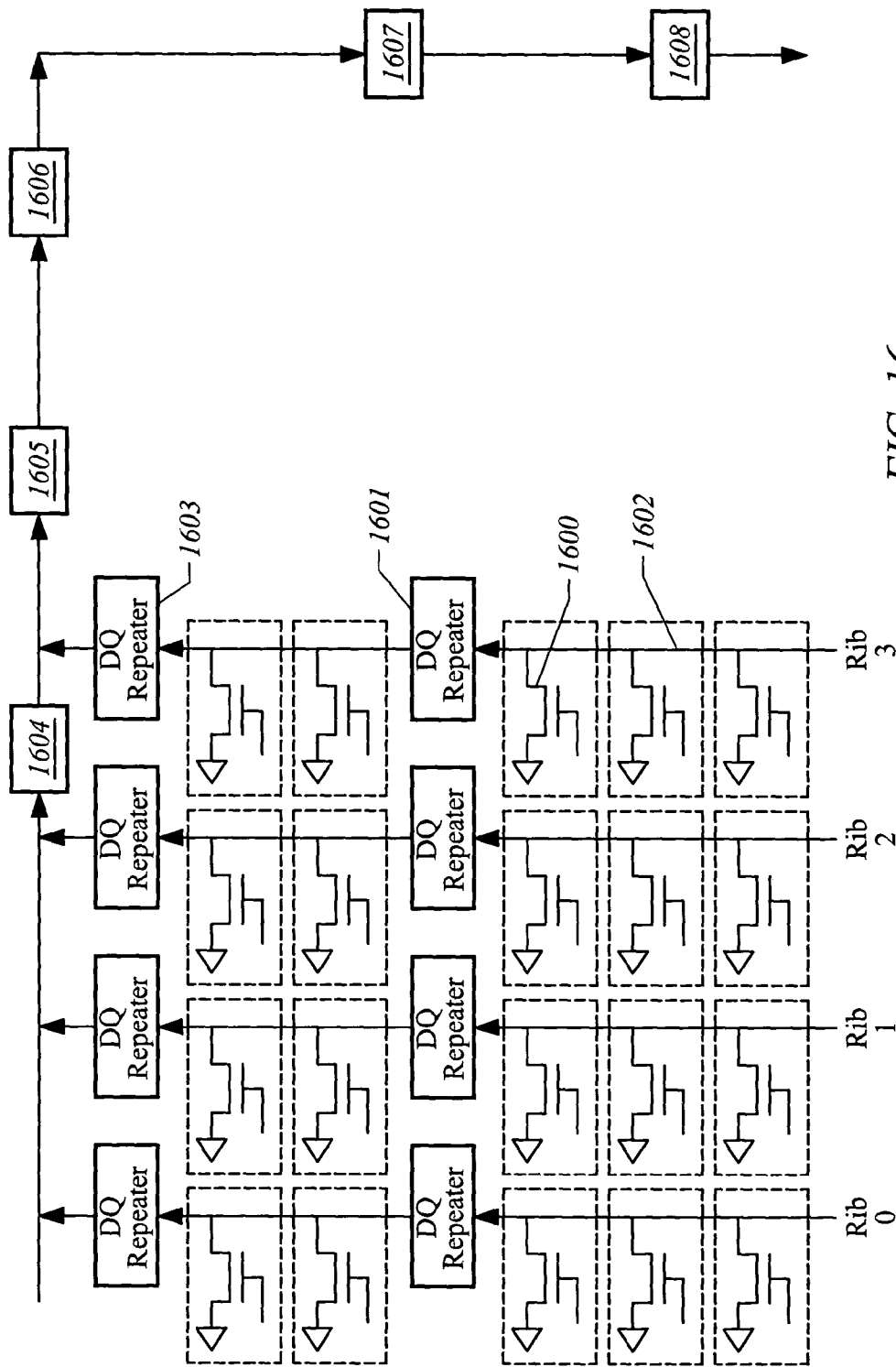
FIG. 16 illustrates signal propagation paths for data and the timing signals on data path ribs according to an architecture like that shown in FIG. 13.

FIG. 16 illustrates an implementation of the data paths along the ribs. The ribs are sets of pre-charged signal transmission lines on which data and timing signals are carried using pulldown transistors, such as transistor 1600 in FIG. 16, and shown in more detail in FIG. 14. The data paths along the ribs are segmented by data path repeaters, which are also enabled by decoders, which determine whether the addressed bank precedes the respective repeaters. Thus, for the repeater 1601, the decoder determines whether the addressed bank resides on the data path segment 1602 which precedes the repeater. For the repeater 1603, the decoder determines whether the address bank resides on rib3. For the repeaters 1604–1607 arranged along the data path spine, the respective decoders determine whether the addressed rib precedes the repeater. The data and timing signals from the addressed banks are propagated up the data path ribs and along the data path spine. At block 1608, the data signal is latched by the data valid signal, and the measure_data signal is latched by the measure_valid signal to produce output data and dummy data, respectively.

Figure 17:
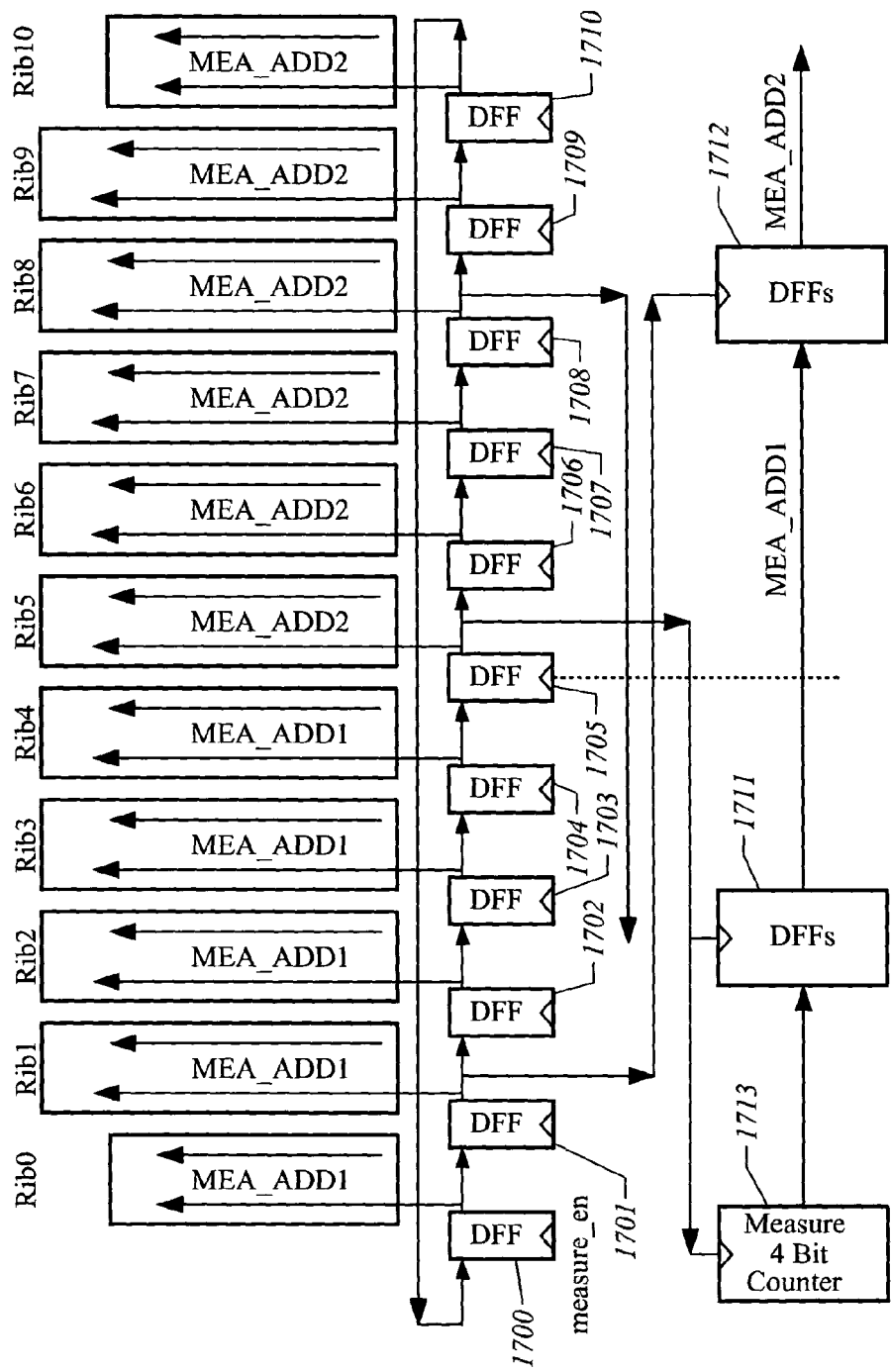
FIG. 17 shows logic used for distributing measure address signals among banks in a memory block according to an implementation of the present invention.

FIG. 17 illustrates logically the manner in which the measure bank addresses are generated. A particular rib in the block is selected by a measure_en signal. This signal is generated by the shift register implemented by flip-flops 1700 through 1710. One rib (rib0 through rib10) is enabled at a time. The bank within the rib is selected by a measure address signal, provided at register 1711, MEA_ADDR1, or provided at register 1712, MEA_ADDR2. The measure address is incremented by a four bit counter 1713. In operation, the measure address MEA_ADDR1 is applied to ribs rib0 through rib4, and the measure address MEA_ADDR2 is applied to the ribs rib5 through rib10. The counter 1713 is initiated with an address (such as 0000) for a first bank on the rib. When the measure_en signal is output by flip-flop 1701, the address MEA_ADDR1 at register 1711 is latched at register 1712 as MEA_ADDR2. When the measure_en signal is output by flip-flop 1705, the counter is incremented by one. When the measure_en signal is output by flip-flop 1708, the output of the counter 1713 is latched in register 1711 as MEA_ADDR1. This scheme guarantees enough setup and clk-q time for the counter 1713 and DFFs 1711, 1712. The scan pattern is repeated for the block so that all the banks in the block are measured in sequence.

Figure 18:
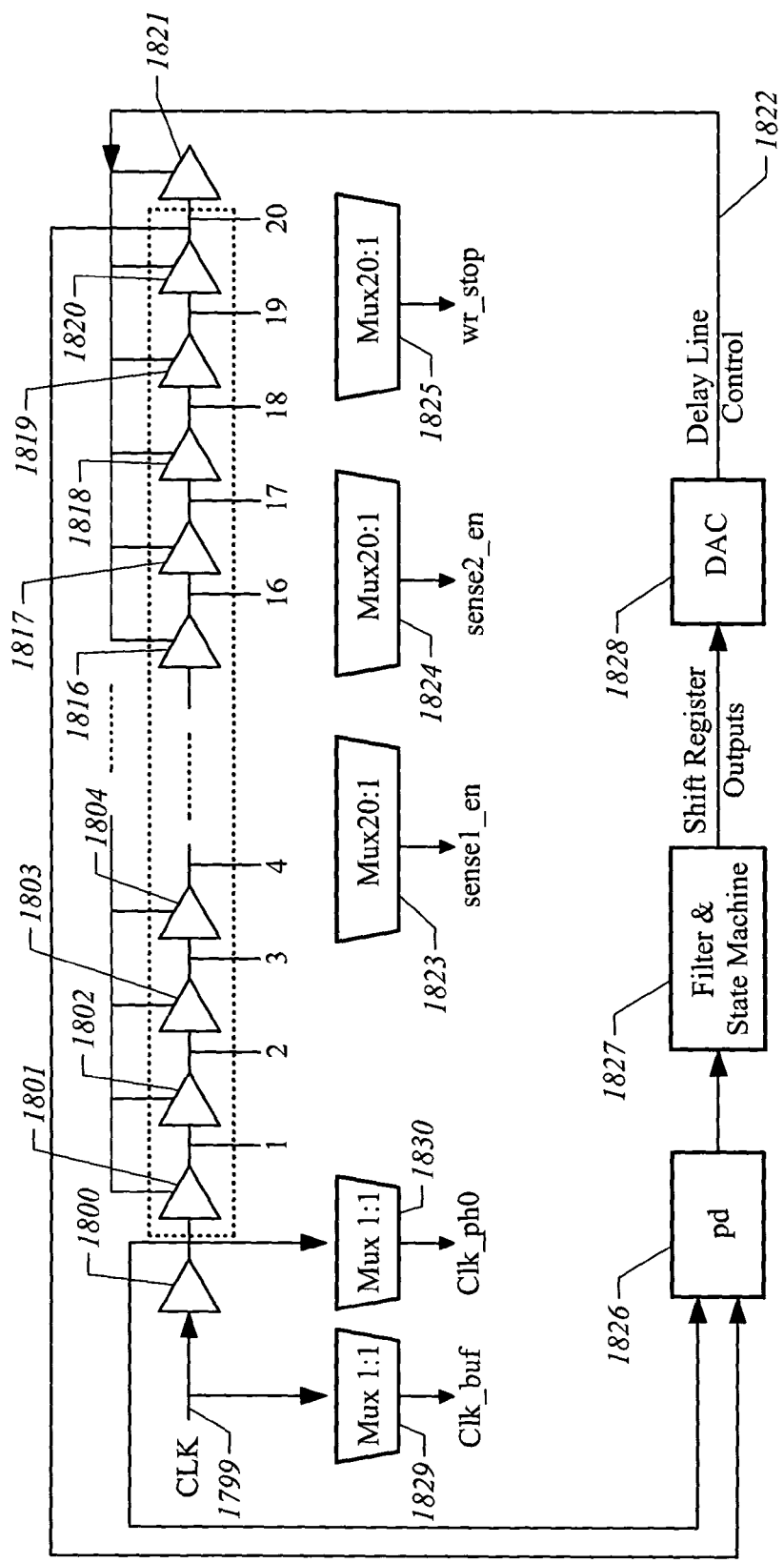
FIG. 18 illustrates an implementation of a delay locked loop for generation of clock signals in a clock generator.

FIG. 18 illustrates an implementation of a delay locked loop for generating the timing signals for the memory blocks according to a system like that of FIG. 1. The delay locked loop comprises a sequence of buffers 1800, 1801, 1802, 1803, 1804, . . . 1816, 1817, 1818, 1819, 1820 and 1821 arranged in series. The buffers 1801–1821 have a delay value which is determined by the control signal on line 1822, which is used to control the delay locked loop. The output of each buffer 1801–1820 is provided as input taps to multiplexers 1823, 1824, 1825. The output of multiplexer 1823 is the sense1_en signal. The output of multiplexer 1824 is the sense2_en signal. The output of multiplexer 1825 is a timing signal wr_stop, used in a particular bank architecture.

The output of buffer 1820 is fed back along with the output of buffer 1800 to a phase detector 1826. Phase detector output is applied to the filter and state machine block 1827. The output of the filter and state machine block 1827 is applied to a digital-to-analog converter DAC 1828 which produces the control signal on line 1822. Multiplexers 1829 and 1830 are emulating the delay of multiplexers 1823, 1824, and 1825. They are coupled to the clock input on line 1899 and the output of buffer 1800, respectively, to produce clock signals used on the chip. The basic operation of delay locked loops is known in the art.

Figure 19:
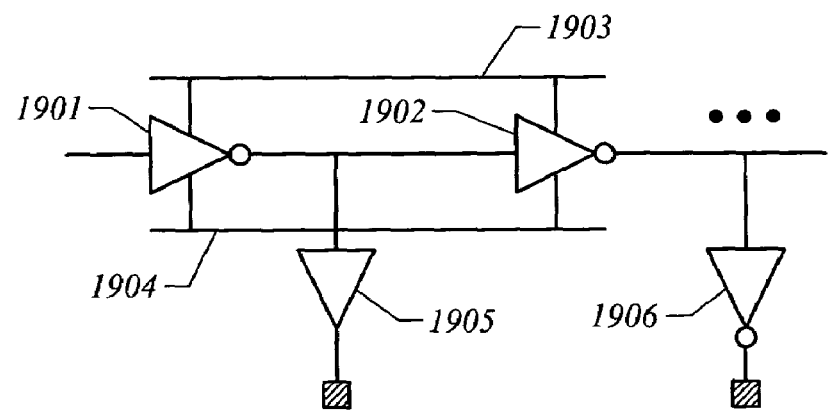
FIG. 19 illustrates a logical implementation of delay line stages for a delay line used for generation of clock signals in a clock generator.

The controllable delay line 210 used in the clock generator is implemented as described with respect to FIGS. 19–25. FIG. 19 illustrates the basic implementation of the delay line, which includes 20 inverting buffers, such as inverters 1901, 1902, in series. The inverters have a delay which is determined by the control signals across lines 1903, 1904. The outputs of the delay line include a non-inverting output buffer 1905, and an inverting output buffer 1906 in alternating stages. This is done to avoid 180 phase shift between adjacent output taps.

Figure 20:
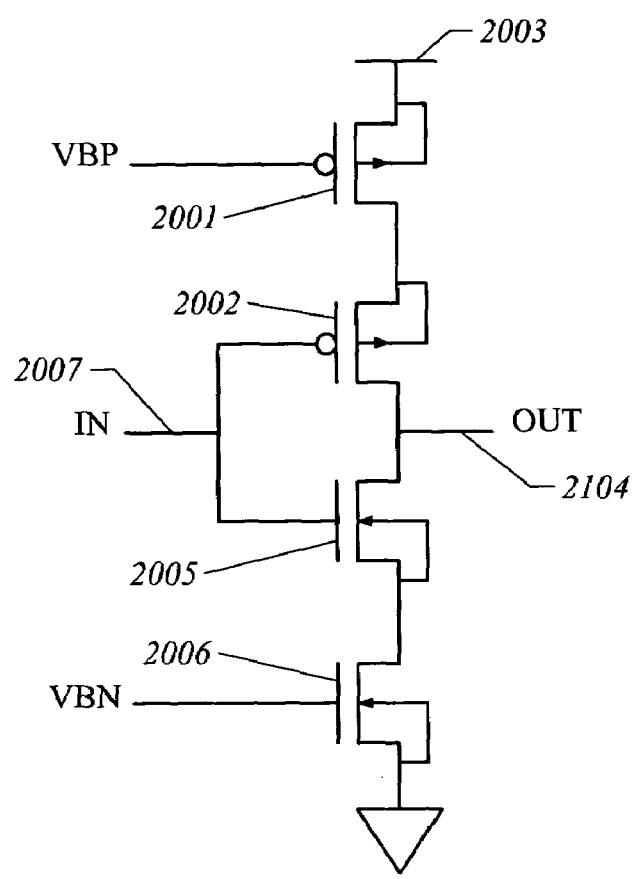
FIG. 20 is a circuit diagram of a delay line stage for use in a delay line like that shown in FIG. 19.

A circuit diagram for a delay stage in the delay line, such as stage 1901, is illustrated in FIG. 20. The delay stage comprises an inverter having two p-type transistors 2001 and 2002 in series between the power supply terminal 2003 and the output 2004. Also, two n-type transistors 2005, 2006 are connected in series between the output 2004 and ground. The gates of transistors 2002 and 2005 are connected to the input on line 2007. The gate of transistor 2001 is connected to the control signal (bias potential) VBP. The gate of transistor 2006 is connected to the control signal (bias potential) VBN. This delay line is designed to operate at around 400 to 500 MHz, with delays per stage on the order of 100 picoseconds.

Figure 21:
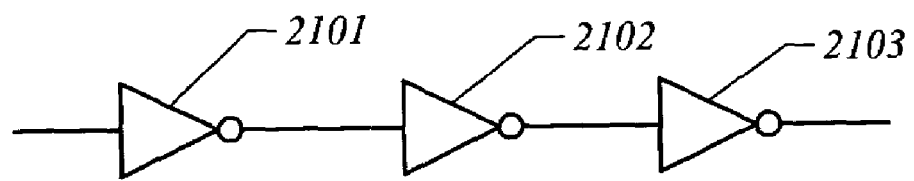
FIG. 21 is a circuit diagram of an inverting output buffer for use in a delay line like that shown in FIG. 19.
Figure 22:
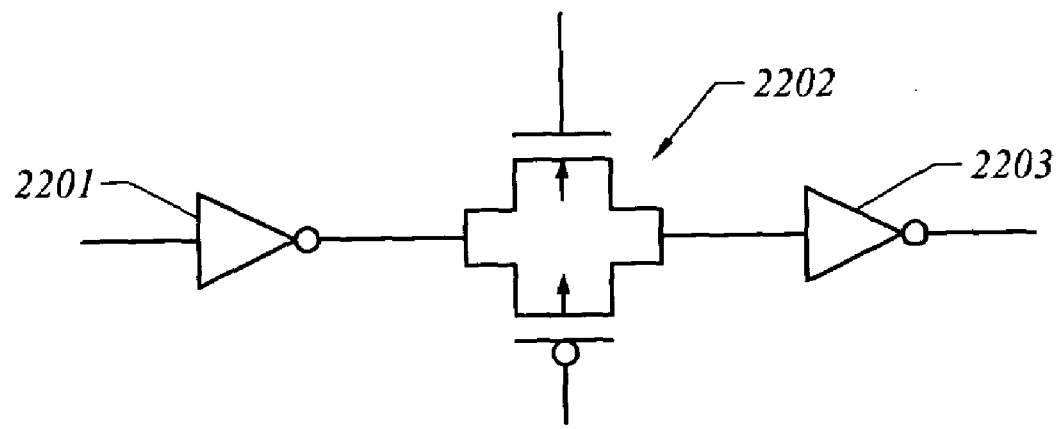
FIG. 22 is a circuit diagram of a non-inverting output buffer for use in a delay line like that shown in FIG. 19.
Figure 24:
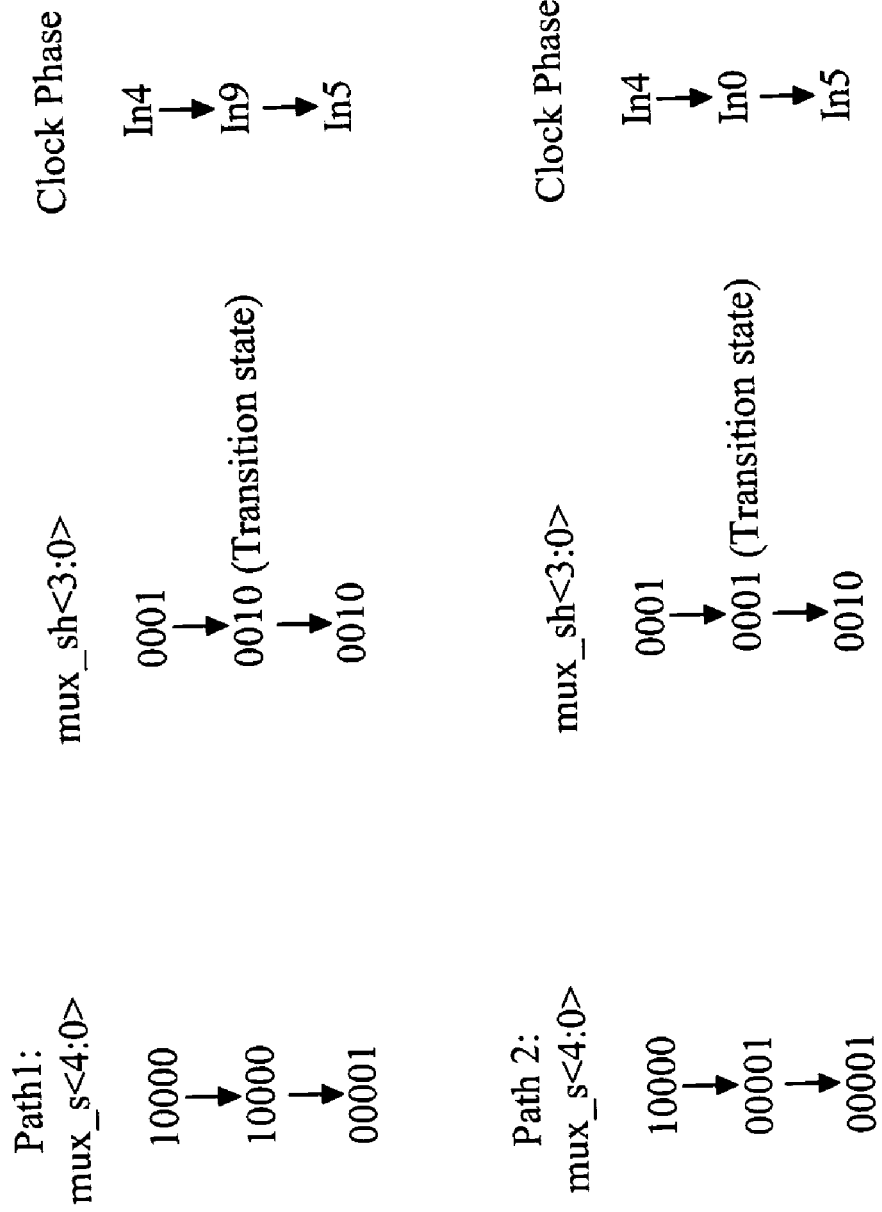
FIG. 24 illustrates problems with operation of prior art decoding techniques for delay lines.

FIG. 21 illustrates implementation of an inverting output buffer. Basically, the inverting output buffer consists of three inverters 2101, 2102, 2103 in series for driving the clock signal having a selected phase. FIG. 22 illustrates an implementation of a non-inverting output buffer. The non-inverting output buffer includes inverter 2201, pass gate 2202, and inverter 2203. The delay of the non-inverting output buffer and the inverting output buffer are substantially the same so that the changes in phase between the taps of the delay line are substantially conserved.

The 20 output taps for the adjustable delay line are applied to a two-stage multiplexer, where the first stage includes four first stage multiplexers, which in this embodiment comprise 5:1 multiplexers having inputs coupled respective five-member sets of the 20 output taps on the adjustable delay line. The second stage is a 4:1 multiplexer has inputs coupled to the outputs of the four first stage multiplexers, and provide an output from a selected tap, providing an overall 20:1 multiplexing operation. First stage control signals are applied to the plurality of first stage multiplexers, and a second stage control signals are applied to the second stage multiplexer.

Using shift registers and a regular coding scheme to control multiplexing, the prior art control table shown in FIG. 23 is implemented. The main problem with the prior art coding scheme is that when the shift occurs in the higher control bits (mux_sh(3:0)), transitions on two multiplexers are occurring. For example, when the transition occurs between taps corresponding to clock phases In4 and In5, both multiplexer stages have to shift in the prior art implementation. Because the shift cannot happen precisely simultaneously, one of the paths shown in FIG. 24 must be taken.

In critical implementations, the difference between the unwanted and desirable clock phases is too large. Thus, large glitches could be seen in the output of the delay line multiplexers during transitions. To avoid these glitches, the coding scheme shown in FIG. 25 is utilized. As can be seen, in all cases for all pairs of adjacent taps a shift from a current tap to an adjacent tap in the pair, requires only one of the control bits to shift so that only one of the first stage or the second stage multiplexers switches. The implementation of the coding scheme has completely removed the glitches in the output of the delay line's multiplexers. Implementation of the code of FIG. 25 is readily implemented using simple logic, as shown in FIG. 27.

Figure 26:
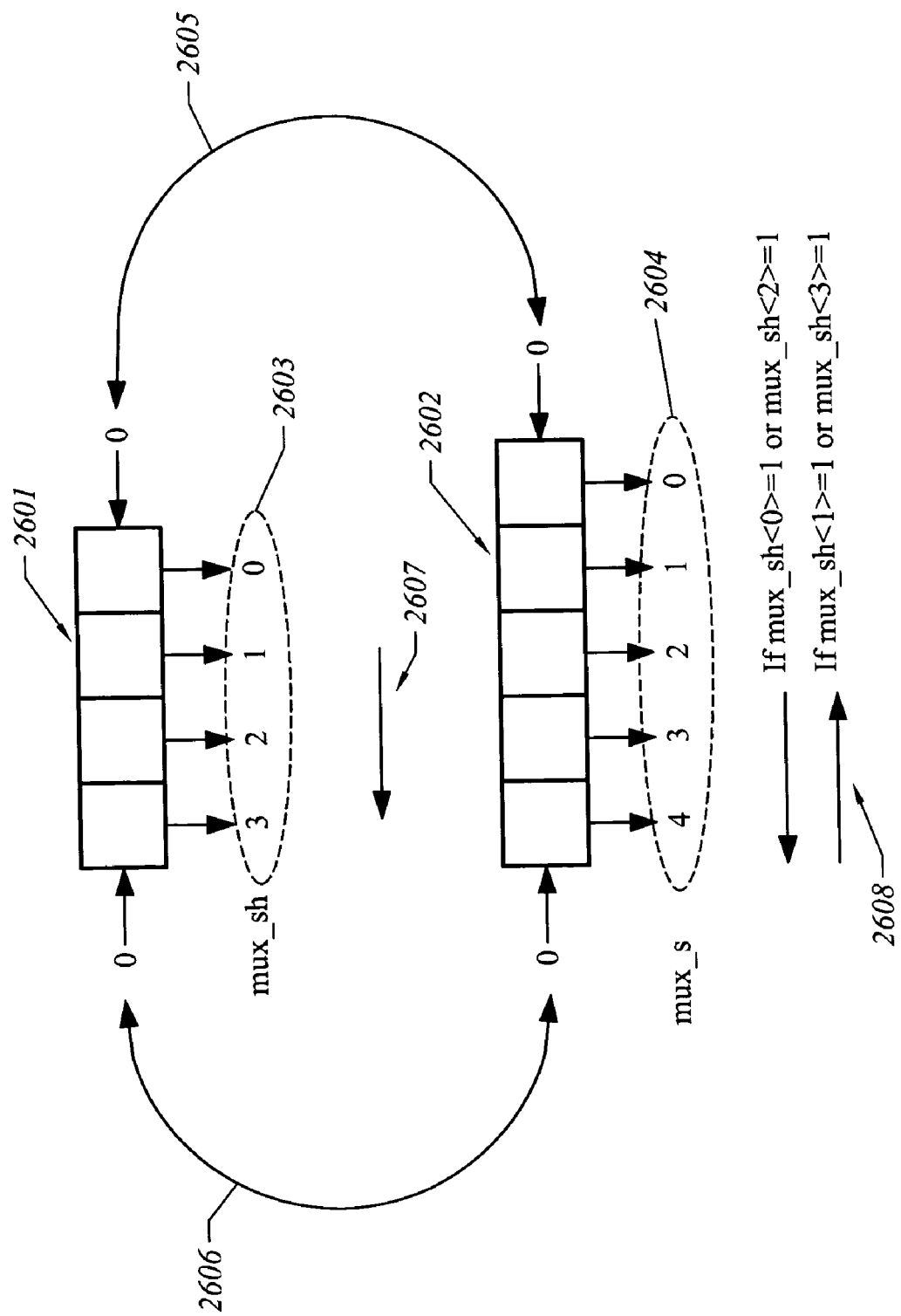
FIG. 26 is a logic diagram of the multiplexer control circuit for the controllable delay line of FIGS. 19–25.

FIG. 26 shows a logic diagram of the multiplexer control circuitry for the controllable delay line of FIGS. 19–25. The multiplexer control logic includes a higher order bits (second stage) shift register 2601 and a lower order bits (first stage) shift register 2602, which are normal bidirectional shift registers. Both of them are reset to having 1's (select) as their LSBs and 0's (unselect) for the rest of their bits 2603–2604. During shifting in either direction, both of them are fed with 0's (unselect) 2605–2606. The higher order bits shift register 2601 shifts in a next shift after the lower order bits shift register 2602 has gone through one full shift, i.e., the 1 (select) bit has gone from one end to the other end of the shift register 2602.

The direction of shift for increasing the delay of the delayline is also shown 2607–2608. For the higher control bits, second stage shift register 2601, this direction 2607 is always the same. For the lower control bits, first stage shift register 2602, this direction depends on the values in the higher control bits shift register 2601. As shown, if even position bits <0> or <2> of the second stage shift register 2601 are 1, then first stage shift register 2602 will shift in the same direction as shift register 2601; otherwise, if odd position bits <1> or <3> of the second stage shift register 2601 are 1, the first stage shift register 2602 will shift in the opposite direction. While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

What is claimed is:

1. In a device providing an output signal, an apparatus for generating output clock pulses for the output signal, comprising:
   a clock generator producing an output clock signal having periodic cycles with leading and following edges;
   an output clock pulse forming circuit, coupled to the clock generator, which produces output clock pulses for corresponding output clock cycles in response to the leading and following edges of the output clock cycles and a relative phase of transitions of the output signal and the leading edges of the output clock cycles.

2. The apparatus of claim 1, wherein the output clock pulse forming circuit includes:
   circuitry to generate a leading edge of the output clock pulse upon the leading edge of the corresponding output clock cycle if the transition of the output signal occurs before the leading edge of the corresponding output clock cycle, and upon a transition of the output signal if the transition of the output signal occurs after the leading edge of the corresponding output clock cycle; and
   circuitry to generate a following edge of the output clock pulse upon an following edge of the corresponding output clock cycle if the transition of the output signal occurs before the leading edge of the corresponding output clock cycle, and upon an edge of a delayed output clock signal if the transition of the output signal occurs after the leading edge of the corresponding output clock cycle.

3. The apparatus of claim 1, including:
   a memory including memory cells, and having address/data paths and timing paths which emulate the address/data paths, the address/data paths outputting said output signal in response to addresses and the timing paths outputting dummy data in response to an address emulation signal; and
   an output clock phase detector coupled to the clock generator, to the output clock pulse forming circuit, and to the timing paths of the memory, which generates signals indicating the relative phase of transitions of the output signal and the leading edges of the output clock cycles in response to the dummy data and the output clock cycles.

4. The memory device of claim 1, including
   a memory including memory cells, and having address/data paths and timing paths which emulate the address/data paths, the address/data paths outputting said output signal in response to addresses and the timing paths outputting dummy data in response to an address emulation signal; and
   an output clock phase detector coupled to the clock generator, to the output clock pulse forming circuit, and to the timing paths of the memory, which generates signals indicating the relative phase of transitions of the output signal and the leading edges of the output clock cycles in response to the dummy data and the output clock cycles; wherein
   the clock generator generates a sense enable signal supplied to the memory, and having a period substantially equal to the output clock cycles, and said memory comprises a plurality of memory banks, memory banks having respective sense amplifiers responsive to said sense enable signal, and said address/data path comprises
   address path spines which extend in a first direction among said plurality of memory banks, address path ribs that extend orthogonally with respect to said address path spines, and decoding circuitry for enabling portions of said address path spines and address path ribs for access to addressed memory banks; and
   data path spines which extend in said first direction adjacent said memory banks and to output structures for data from the memory, and data path ribs among said memory cell blocks which extend orthogonally with respect to said first direction from sense amplifiers in said plurality of memory banks to said data path spines;

wherein said timing paths are co-located with said address path spines, address path ribs, data path ribs and data path spines.

5. The memory device of claim 1, including output structures to output the output signal, and wherein said output structures are responsive to said output clock pulses.

6. The memory device of claim 1, including output structures to output the output signal, and wherein said output structures output an echo clock in response to said output clock pulses.

7. The apparatus of claim 1, wherein the clock generator comprises adjustable circuitry to adjust the relative phase of said output clock cycles in response to the relative phase of transitions of the output signal and the leading edges of the output clock cycles.

8. The apparatus of claim 1, including:
an output clock phase detector coupled to the clock generator, to the output clock pulse forming circuit, and to the timing paths of the memory, which generates signals indicating the relative phase of transitions of the output signal and the leading edges of the output clock cycles; wherein
the clock generator comprises adjustable circuitry to dynamically adjust the relative phase of said output clock cycles in response to the relative phase of transitions of the output signal and the leading edges of the output clock cycles.

9. A memory device in which output data is supplied on an output in an output clock cycle within a read latency of more than one output clock cycle, comprising:
a memory including a set of blocks of memory cells, the members of said set of blocks having respective address/data paths and respective timing paths collocated with the address/data paths, the address/data paths outputting data for the respective blocks in response to addresses and the timing paths outputting dummy data for the respective blocks in response to an address emulation signal;
a set of clock channels having respective inputs and outputs;
a clock generator, responsive to an input clock, producing an output clock signal having said output clock cycles with an adjustable phase and a dummy data reference clock signal on the inputs of clock channels in the set of clock channels, and producing an address emulation signal on the timing paths for the blocks in the memory, the address emulation signal and the dummy data reference clock signal having substantially equal periods that are a multiple of the output clock cycle long;
clock control logic coupled to the clock generator that adjusts the adjustable phase of the output clock signal on the inputs of clock channels in the set of clock channels; and
an output clock pulse forming circuit, coupled to the output of the clock channels, which produces output clock pulses for corresponding output clock cycles in response to the leading and following edges of the output clock cycles and a relative phase of transitions of the dummy data and the leading edges of the output clock cycles.

10. The memory device of claim 9, wherein the output clock pulse forming circuit includes:

circuitry to generate a leading edge of the output clock pulse upon the leading edge of the corresponding output clock cycle if the transition of the output signal occurs before the leading edge of the corresponding output clock cycle, and upon a transition of the output signal if the transition of the output signal occurs after the leading edge of the corresponding output clock cycle; and circuitry to generate a following edge of the output clock pulse upon an following edge of the corresponding output clock cycle if the transition of the output signal occurs before the leading edge of the corresponding output clock cycle, and upon an edge of a delayed output clock signal if the transition of the output signal occurs after the leading edge of the corresponding output clock cycle.

11. The memory device of claim 9, wherein said memory cells comprise thyristor-based memory cells.

12. The memory device of claim 9, wherein the clock generator generates a sense enable signal supplied to the memory, and having a period substantially equal to the output clock period, and said memory blocks comprise respective pluralities of memory banks, memory banks having sense amplifiers responsive to said sense enable signal, and said address/data path comprises
address path spines which extend in a first direction among said plurality of memory banks, address path ribs that extend orthogonally with respect to said address path spines, and decoding circuitry for enabling portions of said address path spines and address path ribs for access to addressed memory banks; and
data path spines which extend in said first direction adjacent said memory banks and to output structures for data from the memory, and data path ribs among said memory banks which extend orthogonally with respect to said first direction from sense amplifiers in said plurality of memory banks to said data path spines;
wherein said timing paths for said address emulation signal and said dummy data are co-located with said address path spines, address path ribs, data path ribs and data path spines.

13. The memory device of claim 9, including output structures to output data accessed from the plurality of memory blocks, and wherein said output structures are responsive to said output clock pulses.

14. The memory device of claim 9, including output structures to output data accessed from the plurality of memory blocks, and wherein said output structures output an echo clock in response to said output clock pulses.

15. For a device providing an output signal, method for generating output clock pulses for the output signal, comprising:
generating an output clock signal on the device, the output clock signal having periodic cycles with leading and following edges;
forming output clock pulses for corresponding output clock cycles on the device in response to the leading and following edges of the output clock cycles and a relative phase of transitions of the output signal and the leading edges of the output clock cycles.

16. The method of claim 15, wherein forming the output clock pulse includes:

generating a leading edge of the output clock pulse upon the leading edge of the corresponding output clock cycle if the transition of the output signal occurs before the leading edge of the corresponding output clock cycle, and upon a transition of the output signal if the transition of the output signal occurs after the leading edge of the corresponding output clock cycle; and generating a following edge of the output clock pulse upon an following edge of the corresponding output clock cycle if the transition of the output signal occurs before the leading edge of the corresponding output clock cycle, and upon an edge of a delayed output clock signal if the transition of the output signal occurs after the leading edge of the corresponding output clock cycle.

17. The method of claim 15, wherein said device comprises a memory including memory cells, and having address/data paths and timing paths which emulate the address/data paths, the address/data paths outputting said output signal in response to addresses and the timing paths outputting dummy data in response to an address emulation signal; and including generating signals indicating the relative phase of transitions of the output signal and the leading edges of the output clock cycles in response to the dummy data and the output clock cycles.

18. The method of claim 17, wherein said memory cells comprise thyristor-based memory cells.

19. The method of claim 15, including latching the output signals in response to said output clock pulses.

20. The method of claim 15, including supplying an echo clock in response to said output clock pulses at an output of the device.

* * * * *